(12) United States Patent
Taniguchi

(10) Patent No.: US 7,629,596 B2
(45) Date of Patent: Dec. 8, 2009

(54) METHOD OF PRODUCING 3-D MOLD, METHOD OF PRODUCING FINELY PROCESSED PRODUCT, METHOD OF PRODUCING FINE-PATTERN MOLDED PRODUCT, 3-D MOLD, FINELY PROCESSED PRODUCT, FINE-PATTERN MOLDED PRODUCT AND OPTICAL COMPONENT

(75) Inventor: Jun Taniguchi, Ibaraki (JP)

(73) Assignee: Tokyo University of Science Educational Foundation Administrative Organization, Tokyo (JP)

( * ) Notice: Subject to any disclaimer, the term of this patent is extended or adjusted under 35 U.S.C. 154(b) by 226 days.

(21) Appl. No.: 11/816,773

(22) PCT Filed: Feb. 21, 2006

(86) PCT No.: PCT/JP2006/303084

§ 371 (c)(1),
(2), (4) Date: Aug. 21, 2007

(87) PCT Pub. No.: WO2006/088209

PCT Pub. Date: Aug. 21, 2006

(65) Prior Publication Data

US 2009/0026583 A1  Jan. 29, 2009

(30) Foreign Application Priority Data

Feb. 21, 2005 (JP) .............................. 2005-044588
Nov. 8, 2005 (JP) .............................. 2005-323418

(51) Int. Cl.
*B29C 33/38* (2006.01)

(52) U.S. Cl. ............ 250/492.2; 250/492.1; 250/492.22; 250/492.3; 430/4; 430/5; 430/399; 430/310; 438/795; 438/798

(58) Field of Classification Search .............. 250/492.1, 250/492.2, 492.22, 492.3; 438/795, 798; 430/4, 5, 256–259, 269, 296, 297, 299, 310; 719/19–21

See application file for complete search history.

(56) References Cited

U.S. PATENT DOCUMENTS 5,432,714 A * 7/1995 Chung et al. .............. 250/492.2
2003/0178580 A1 * 9/2003 Harnack et al. .......... 250/492.2

(Continued)

FOREIGN PATENT DOCUMENTS

JP  60-263145  12/1985

OTHER PUBLICATIONS

Chou, S.Y., et al. Imprint of Sub-25 nm vias and Trenches in Polymers, Applied Physics Letters 67, pp. 3114-3116 (1995).

(Continued)

*Primary Examiner*—David A Vanore
*Assistant Examiner*—Michael Maskell
(74) *Attorney, Agent, or Firm*—Thomas, Kayden, Horstemeyer & Risley, LLP; Todd Deveau

(57) ABSTRACT

To provide production methods for a 3-D mold, a finely processed product, and a fine pattern molded product in which the depth and the line width can be formed with high precision, a 3-D mold, a finely processed product, a fine-pattern molded product, and an optical element formed with high precision.

A method of producing a 3-D mold that is configured to control depth within 10 nm and form a line width of 200 nm or less, wherein an irradiation step, which irradiates an electron beam to a resist layer of an object of processing that has the resist layer constituted with a polysiloxane-based material on or above a substrate, includes a step having irradiation conditions such that the acceleration voltage is from 1 kV to 3 kV without generation of the backscattering and the dosage is 400 $\mu C/cm^2$, a method of producing finely processed product using the 3-D mold, a method of producing fine-pattern molded product using the 3-D mold or the finely processed product, and the 3-D mold, the finely processed product, the fine-pattern molded product, and an optical element formed with high precision with these production methods.

15 Claims, 16 Drawing Sheets

FOREIGN PATENT DOCUMENTS

| | | |
|---|---|---|
| JP | 62-109049 | 5/1987 |
| JP | 06-196086 | 7/1994 |
| JP | 07-219228 | 8/1995 |
| JP | 2002-192500 | 7/2002 |
| JP | 2002-196494 | 7/2002 |
| JP | 2004-66447 | 3/2004 |
| JP | 2005-19426 | 1/2005 |
| WO | WO 2004/027843 | 4/2004 |

OTHER PUBLICATIONS

Taniguchi, J., et al. "3D imprint technology using substrate voltage change", Applied Surface Science, Elsevier, Amsterdam, NL, vol. 238, No. 1-4, Nov. 15, 2004, pp. 324-330.

EPO Communication dated Oct. 9, 2008, including Supplementary Search Report.

* cited by examiner

FIG. 5
(1) DROPPING OF OPTICAL SETTING RESIN
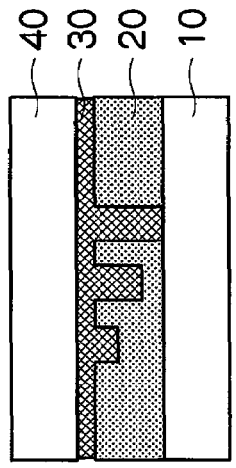
(2) PRESSURIZE
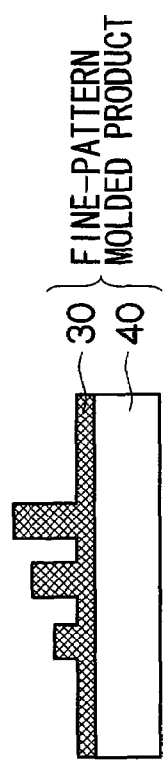
(3) CURING
ULTRAVIOLET IRRADIATION OR HEATING
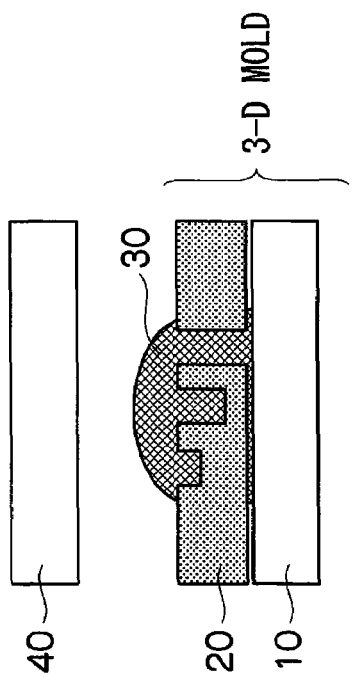
(4) SEPARATION OF MOLD
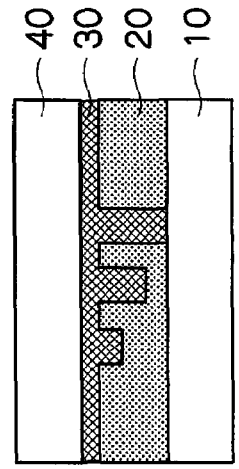

METHOD OF PRODUCING 3-D MOLD, METHOD OF PRODUCING FINELY PROCESSED PRODUCT, METHOD OF PRODUCING FINE-PATTERN MOLDED PRODUCT, 3-D MOLD, FINELY PROCESSED PRODUCT, FINE-PATTERN MOLDED PRODUCT AND OPTICAL COMPONENT

RELATED APPLICATION

This application claims priority to and the benefit of Japanese Patent Application No. 2005-0044588 filed Feb. 21, 2005 and Japanese Patent Application No. 2005-323418 filed Nov. 8, 2005.

TECHNICAL FIELD

The present invention relates to a method of producing a 3-D mold using an electron beam irradiation drawing technique according to which the 3-D mold can be formed with high precision, a method of producing a finely processed product using the 3-D mold, a method of producing a fine-pattern molded product using the 3-D mold or the finely processed product, the 3-D mold, the finely processed product, the fine-pattern molded product, and an optical element obtained with these production methods.

BACKGROUND ART

A lithography technique to replace the conventional semiconductor lithography technique has been sought in view of miniaturization of semiconductor devices. Nano-imprint lithography exists as one such technique, in which a mold produced by electron beam irradiation is used (for example, refer to Non-Patent Document 1). This technique is capable of manufacturing a design rule on the order of nanometers (for example, refer to Patent Document 1). A schematic of this process is that a fine pattern is formed by pressing a mold in which a pattern of nanometer size is drawn and the mold is transferred to a resist on a substrate. In this process, a thermoplastic resin is used as a resist material.

In the formation of the fine pattern of a mold manufactured by the electron beam irradiation, first, the temperature of a resist is raised to the glass transition temperature or higher, and then the mold is pressed to the resist. In this state, the temperature of the resist is lowered and the resist is hardened. Next, the mold is peeled. Thereby, a pattern can be formed on the substrate.

The mold is the most important component in nano-imprint lithography. This is because the precision of the mold determines the precision of the product. Heat resistivity, durability, and the like are necessary in manufactured molds, and adhesiveness between the substrate and a resist layer, electron beam sensitivity of the resist, dry etching durability, an analog property in which the processed depth can be controlled corresponding to an exposure amount of the electron beam, and the like, are necessary in the manufacturing method for the mold.

In order to solve these problems, a resist such as a positive resist including an alkoxysilane group-included a vinyl-based polymer and a curing catalyst (for example, refer to Patent Document 2), and a resist including an aromatic polyamide and an acid generator (for example, refer to Patent Document 3), for example, have been developed. Further, a method has been proposed in which the dry etching durability of the resist is focused on and the resist layer is formed as a two-layered structure (for example, refer to Patent Document 4). For the analog property, a method of irradiating an electron beam by changing the accelerating voltage within a low accelerating voltage range has been disclosed (for example, refer to Patent Document 5). Numerous techniques applying nano-imprint lithography have been disclosed and, for example, a method of manufacturing a field emission negative electrode equipped with a fine needle shaped electrode (for example, refer to Patent Document 6) has been disclosed.

A conventional fine processing method by electron beam irradiation is performed at a high acceleration voltage of 50 kV or higher, and mostly at 100 kV or higher, as described in Patent Document 2 and Patent Document 3. Together with this, a high irradiation dose (also referred to as a dosage), for example 500 $\mu C/cm^2$ or more of the irradiation dose, inevitably becomes necessary, and there is even a case in which an irradiation dose of about $10^5$ $\mu C/cm^2$ is used, which results in, for example, one drawing requiring a long time such that productivity is extremely low. Further, with respect to apparatus, apparatus using a high acceleration voltage is expensive, and energy efficiency is poor due to large power consumption.

The reason for using a high acceleration voltage is that it is effective to produce a pattern where the depth is almost fixed, such as a two-dimensional mold such as a semiconductor, by repeating irradiation of a fine beam corresponding to a desired pattern, because the electron beam is implanted into a substrate penetrating through the resist while keeping a fine beam diameter due to the ease of turning down the diameter of the electron beam and a decreased interaction between the electrons and the resist. However, the sensitivity decreases with the decrease of the interaction, and a high dosage becomes necessary to compensate for this, resulting in the problem that drawing requires a long time.

In this way, conventionally, the prevailing method of fine processing with electron beam irradiation has been the production of a two-dimensional mold pattern, and there have been few examples of application to the production of a 3-D pattern in which height, depth, and line width are changed.

In the case of manufacturing a 3-D pattern, conventionally, a method of increasing and decreasing the irradiation dose by fixing the voltage in the range of the high acceleration voltage, the so-called high acceleration dose modulation method, is also generally used. However, normally, an electron beam resist is sensitive to the change in the irradiation dose and the height, the depth, and the line width change thereby, controllability is low, control of the line width and control of the depth are both at about 50 nm even if the controllability is high, and it is difficult to manufacture a desired 3-D fine pattern.

Furthermore, with this kind of high acceleration voltage, normally, an incident electron passes the resist layer and is implanted into the substrate, and then bounces back in the direction of incidence, scatters over a wide range (referred to as backscatter) and energy is stored in the resist. Particularly, in the case of performing the irradiation at two places, when the mutual irradiation range is narrow, scattering electrons overlap each other (the stored energy is referred to as a proximity effect), and as a result, this energy becomes the cause of disturbance of the precision of processing in the depth direction and/or the width direction of a finely processed pattern.

In particular, because the irradiation dose is changed due to influence of the backscattering electrons, the reproduction of a 3-D fine pattern becomes even more difficult.

Various methods to suppress the effect on a processed pattern dimension by controlling this proximity effect due to the backscattering electrons have been proposed.

For example, in the case of electron beam irradiation fine processing with a high acceleration voltage, since the sensitivity is poor, a method exists of increasing sensitivity in advance by separately performing electron beam irradiation with a low acceleration voltage of about 30 kV and then performing the irradiation with an acceleration voltage of about 100 kV repeatedly (for example, refer to Patent Document 7). However, the correction effect by these methods is insufficient, and these methods have not resulted in obtaining satisfactory processed pattern dimensions.

Therefore, the present inventor has proposed a method of changing the dosage (an irradiation dose) in a high range of about 500 to 10,000 $\mu C/cm^2$ by fixing the acceleration voltage in the range of a low region in order to control the processed depth of the resist layer, has clarified that the acceleration voltage and the processed depth have almost a proportional relationship by changing the acceleration voltage, particularly by changing the apparent acceleration voltage by changing the voltage of a sample stand side, and has proposed a processing and manufacturing method for a resist and a substrate exhibiting an excellent analog property (for example, refer to Patent Document 8).

However, while with this proposal, the processed depth precision can be improved over the conventional method by a low acceleration voltage and a high irradiation dose, it remains insufficient and, further, the control of the line width of a fine line is performed by adjustment of the electron beam diameter, and a satisfactory line width control has not been obtained.

When the line width control is not based on the adjustment of the electron beam diameter, if the irradiation dose is high, it is also considered to be difficult to control a fine line.

Furthermore, depending on the density of the fine pattern or the spacing of the adjacent pattern, there are many cases in which all of the patterns stick together or are left out, and it is extremely difficult to draw, in particular, the line width of a fine line to a desired dimension.

Moreover, it is proposed in Patent Document 5 that a thin film-type micro-optical element that is excellent in optical characteristics is manufactured by changing a voltage in a range of low acceleration voltage within which the electron beam does not reach the substrate. However, there is no description whatsoever related to the irradiation dose and the processing precision, and it is thought that manufacture of an element with high processing precision cannot be anticipated without performing an adjustment of the irradiation dose, even if it is the same as Patent Document 8 in respect of irradiating an electron beam of low acceleration voltage.

In view of the trends in this kind technological development, a processing technology for a finer mold is required, and the development of an outstanding mold production technology that is capable of manufacturing a line width that is impossible with the conventional lithography method or mechanical processing, which is possible to control to a 10 nm processed depth and that is narrower than 200 nm, is highly sought after.

Patent Document 1: Japanese Patent Application Laid-Open (JP-A) No. 2002-192500
Patent Document 2: JP-A No. 2002-196494
Patent Document 3: JP-A No. 07-219228
Patent Document 4: JP-A No. 60-263145
Patent Document 5: JP-A No. 62-109049
Patent Document 6: JP-A No. 6-196086
Patent Document 7: JP-A No. 2005-19426
Patent Document 8: International Publication No. 2004/027843 A1

Non-Patent Document 1: S. Y. Chou, P. R. Krauss, and P. J. Renstrom: "Imprint of sub-25 nm vias and trenches in polymers," *Applied Physics Letters* 67, pp. 3114-3116 (1995)

DISCLOSURE OF INVENTION

Problems to Be Solved By the Invention

A first problem to be solved by the present invention is to provide an efficient production method for a 3-D mold in which the irradiation time of the electron beam is shortened and the production efficiency is high.

Further, a second problem to be solved by the present invention is to provide a production method for a 3-D mold that is capable of controlling the processed depth of the mold substantially continuously, in an analog fashion, and precisely.

Further, a third problem to be solved by the present invention is to provide a production method for a 3-D mold that is capable of controlling a fine line width of the mold, and especially to provide a production method for a 3-D mold that is capable of controlling a fine line width in the case that the processed depth is shallow.

Furthermore, a fourth problem to be solved by the present invention is to provide a production method for a finely processed product using the above-described 3-D mold, and a production method for a fine-pattern molded product using the 3-D mold or the finely processed product.

Moreover, a fifth problem to be solved by the present invention is to provide the 3-D mold, the finely processed product, a fine-pattern molded product, and an optical element.

Means for Solving the Problems

The present inventor investigated a fine processing method with electron beam irradiation that is capable of controlling a micro-sized processed depth of about 10 nm using an acceleration voltage in a low region in order to solve the above-described problems, aiming at high productivity so that one drawing can be performed in a short time, higher efficiency and reduced consumption of energy, and miniaturization of apparatus.

Because the sensitivity of the resist is increased due to the interaction with incident electrons and the resist becomes susceptible to development, such that it reaches a soft state, as it were, the lower acceleration voltage becomes, advantages in improvement of productivity and the like are expected when a low acceleration voltage is used. However, on the other hand, a problem occurs in that the control of the processing precision becomes difficult.

The present inventor recognized that this problem makes control of a processing depth of about 10 nm even more difficult and repeated the investigation and, as a result, focused on the size of the dosage.

As a result, it was confirmed that using a dosage in lower region, rather than the dosage of the size described in Patent Document 8, is effective for performing control of a processing depth of about 10 nm, and that the processing depth can be deepened almost proportional to the increase of the acceleration voltage or the dosage when one of the acceleration voltage or the dosage is fixed and the other is changed.

Further, it was made clear that in the case of processing with a low acceleration voltage, the processed line width broadens due to the influence of forward scattering on the surface of the resist layer and clear processed dimensions are difficult to achieve despite the processed depth becoming shallower. However, in the case of forming a 3-D mold, processing at the shallow part of the processed depth is certainly necessary. Here, it is possible to perform the processing of the resist layer of a line width exceeding 200 nm with a method other than electron beam irradiation. However, processing of a fine line width of 200 nm or less is possible only with electron beam irradiation at present. Therefore, to control a fine line width of 200 nm or less at the shallow part of the processing depth formed with an acceleration voltage of 1 to 3 kV is an extremely important challenge in the processing method for the resist layer by electron beam irradiation.

Then, the present inventor continued investigation of the fine processing method with electron beam irradiation in which the line width can be processed to about 200 nm or less when using a low acceleration voltage.

However, according to the experimental results of the present inventor, it is confirmed that the line width becomes broad and greatly deviates from the initial planned value (the width to be radiated) in most cases when an uneven pattern is formed and tested, and it is understood that pattern control in the case of a low acceleration voltage, and the control of the line width in particular, is extremely difficult.

The reason why the pattern control is difficult, causing a state in which an uneven pattern is collapsed, stuck, or left out, in addition the large deviation of the line width, is surmised to be that when electron beam irradiation is performed on the resist layer in addition to the above-described "highly sensitive state," in the case of the low acceleration voltage, the electron scatters (referred to as forward scattering) and spreads with the incident point of the electron beam of the resist layer as a base point, and the energy of these forward scattering electrons is stored in the near surface region where the incident point directly influences the processing precision as a base point.

In the present invention, such a state of disorder of the uneven pattern is considered to be generically called "an inter-uneven part (also referred to as an uneven pattern) proximity effect caused by the forward scattering electrons."

However, according to the result of the investigation of the present inventor, because almost all of the electrons generated are the forward scattering electrons when using a low acceleration voltage, as opposed to the case of using a high acceleration voltage where both backscattering electrons generated being implanted in the substrate and forward scattering electrons are generated, although the forward scattering electrons are fewer than the backscattering electrons, and the range of the backscattering electrons spreading extends over the entire resist layer, there are few factors that influence the processing precision, and because the spread and storage of the scattering is in a narrow and limited region near the surface having an incident point of the resist layer as a base point, the spread can be more easily predicted than for the backscattering electrons. Therefore, it was recognized that the solution to controlling the line width and the like was easy to investigate.

The present inventor diligently repeated experiments based on this recognition and, as a result, it was confirmed that the adjustment of the dosage is effective in the correction of the above-described proximity effect due to the forward scattering electrons, and a line width of 200 nm or less can be realized when the electron beam irradiation is performed using an acceleration voltage in a low region and the dosage adjusted within the range of a low region, and a 3-D mold without pattern disorder and with high processing precision can be produced.

The present inventor repeatedly performed experiments and demonstrations in this way and, as a result, discovered a fine processing method with electron beam irradiation that is capable of controlling the processing depth to about 10 nm and forming a line width of 200 nm or less, and accomplished the creation of the invention as follows.

⟨1⟩ A method of producing a 3-D mold that is configured to control depth within 10 nm and form a line width of 200 nm or less, the method comprising: an irradiation step of irradiating an electron beam to a resist layer of an object of processing that has the resist layer constituted with a polysiloxane-based material on or above a substrate; and a developing step of developing the resist layer after the electron beam is irradiated to form an uneven part at the resist layer, the method further comprising producing a 3-D mold having a plurality of uneven parts of different processed depth by forming the processed depth proportional to the size of each acceleration voltage or each dosage in a plurality of irradiations in a series of steps of successively performing the plurality of irradiations by fixing one of the acceleration voltage and the dosage of an electron beam and changing the other, and then developing, wherein the irradiation step includes a step having irradiation conditions such that the acceleration voltage is from 1 kV to 3 kV without generation of the backscattering and the dosage is 400 $\mu$C/cm$^2$.

⟨2⟩ The method of producing a 3-D mold according to the ⟨1⟩, wherein an uneven part is formed at the resist layer such that a depth gradation from the substrate is at an increment of a specific value of 8 nm or less by changing the acceleration voltage of the electron beam at an increment of a specific value of 50 V or lower in the irradiation step.

⟨3⟩ The method of producing a 3-D mold according to the ⟨1⟩ or ⟨2⟩, wherein the resist layer of the object of processing is formed by applying a coating liquid including SOG and an organic solvent onto a substrate and then baking at a temperature of 350° C. or higher.

⟨4⟩ The method of producing a 3-D mold according to any one of the ⟨1⟩ to ⟨3⟩, wherein a developing liquid is used to develop in the developing step.

⟨5⟩ The method of producing a 3-D mold according to the ⟨4⟩, wherein the developing time with the developing liquid is from 60 to 300 seconds in the developing step.

⟨6⟩ The method of producing a 3-D mold according to any one of the ⟨1⟩ to ⟨5⟩, wherein the object of processing is provided with an adhesive layer between the substrate and the resist layer.

⟨7⟩ The method of producing a 3-D mold according to any one of the ⟨1⟩ to ⟨6⟩, wherein the thickness of the resist layer is from 20 nm to 10 $\mu$m.

⟨8⟩ A 3-D mold produced by the method according to any one of the ⟨1⟩ to ⟨7⟩

⟨9⟩ A 3-D mold comprising a resist layer having an uneven part provided on a substrate, and having a processed part wherein the height gradation of the resist layer from the substrate is 8 nm or less.

⟨10⟩ A 3-D mold comprising a resist layer having an uneven part provided on a substrate, and having a processed part wherein the line width of the resist layer from the substrate is 200 nm or less.

⟨11⟩ A method of producing a finely processed product which is a substrate having an uneven part, the method comprising a step of forming an uneven part at the substrate by applying an ion beam to the resist layer of the 3-D mold produced by the method of producing a 3-D mold comprising a resist layer having an uneven part provided on a substrate according to any one of the ⟨1⟩ to ⟨7⟩.

⟨12⟩ A finely processed product comprising a processed part with a depth gradation of 8 nm or less.

⟨13⟩ A finely processed product comprising a processed part with a line width of 200 nm or less.

⟨14⟩ The finely processed product of the ⟨12⟩ or ⟨13⟩, comprising diamond, silicon, glass, sapphire, or a heat resistant plastic.

⟨15⟩ A method of producing a fine-pattern molded product comprising a step of transferring a mold by pressing a resin to a 3-D mold using the 3-D mold produced by the method according to any one of the ⟨1⟩ to ⟨7⟩ as the mold for molding, and a step of peeling the resin from the pressed 3-D mold.

⟨16⟩ A method of producing a fine-pattern molded product comprising a step of transferring a mold by pressing a resin to a finely processed product using the finely processed product produced by the method according to the ⟨11⟩ as the mold, and a step of peeling the resin from the pressed finely processed product.

⟨17⟩ A method of producing a fine-pattern molded product comprising a step of transferring a mold by pressing a resin to a mold using the 3-D mold according to ⟨8⟩ or ⟨9⟩ as a mold, and a step of peeling the resin from the pressed 3-D mold.

⟨18⟩ A method of producing a fine-pattern molded product comprising a step of transferring a mold by pressing a resin to a finely processed product using the finely processed product according to the ⟨12⟩ or ⟨13⟩ as the mold, and a step of peeling the resin from the pressed finely processed product.

⟨19⟩ A fine-pattern molded product produced with the method according to any one of the ⟨15⟩ to ⟨18⟩.

⟨20⟩ A fine-pattern molded product comprising a processed portion with a height gradation of 8 nm or less.

⟨21⟩ A fine-pattern molded product comprising a processed portion with a line width of 200 nm or less.

⟨22⟩ An optical element comprising the 3-D mold according to any one of the ⟨8⟩ to ⟨10⟩.

⟨23⟩ An optical element comprising the fine-pattern molded product according to any one of the ⟨19⟩ to ⟨21⟩.

Effect of the Invention

According to the present invention, a method of producing a 3-D mold that is capable of high precision formation, a method of producing a finely processed product using the 3-D mold, a method of producing a fine-pattern molded product using the 3-D mold or the finely processed product, and the 3-D mold, the finely processed product, the fine-pattern molded product, and an optical element can be provided.

BEST MODE FOR CARRYING OUT THE INVENTION

1. Production Method for 3-D Mold

"A method of producing a 3-D mold that is configured to control depth within 10 nm and form a line width of 200 nm or less, the method comprising: an irradiation step of irradiating an electron beam to a resist layer of an object of processing that has the resist layer constituted with a polysiloxane-based material on or above a substrate; and a developing step of developing the resist layer after the electron beam is irradiated to form an uneven part at the resist layer, the method further comprising producing a 3-D mold having a plurality of uneven parts of different processed depth by forming the processed depth proportional to the size of each acceleration voltage or each dosage in a plurality of irradiations in a series of steps of successively performing the plurality of irradiations by fixing one of the acceleration voltage and the dosage of an electron beam and changing the other, and then developing, wherein the irradiation step includes a step having irradiation conditions such that the acceleration voltage is from 1 kV to 3 kV without generation of the backscattering and the dosage is 400 $\mu C/cm^2$" of the present invention is explained.

Moreover, the above-described irradiation conditions specified in the present invention are conditions of controlling the depth within 10 nm and forming a line width of 200 nm or less. However, in a plurality of uneven parts in one 3-D mold, as a matter of course, there are cases when a part at which the depth is not always controlled to within 10 nm and the line width is not always 200 nm or less is formed, as necessary.

In such cases, in a series of irradiation steps successively performed a plurality of times, the irradiation is performed using an acceleration voltage or a dosage divergent from these conditions in addition to the irradiation conditions specified in the present invention, and an uneven part can be formed in which the depth is not controlled within 10 nm and the line width is broader than 200 nm.

"An acceleration voltage that does not generate backscattering" is an acceleration voltage which practically generates only forward scattering in a resist without the irradiated electron beam being implanted in the substrate, and the thickness of the resist becomes a factor. However, it normally means a low acceleration voltage that was not adapted to the conventional dosage modulation method. Therefore, in the present invention, "an acceleration voltage in which backscattering is not generated" is also referred to as "a low acceleration voltage" hereinbelow.

As explained above, in the case of electron beam irradiation using a low acceleration voltage, it is recognized as a problem that improvement of the processing precision of a 3-D mold depends on whether or not the energy of the forward scattering electrons stored near the surface region can be controlled and, in the present invention, the energy of forward scattering electrons is controlled by mainly adjusting only the dosage (the irradiation dose) of an electron beam because the energy of forward scattering electrons is stored at the predictable near-surface region, with a view to resolution of the problem.

When the electron beam irradiation by a low acceleration voltage is performed, sensitivity of the resist becomes high, the resist layer changes over a broad range of the predetermined irradiation pattern size or beyond, a part that can be easily developed is inevitably formed, and the energy of the forward scattering electrons achieves a state of easy storage. Therefore, because this state is inevitably accelerated with a high dosage as in the conventional technology such as of 500 $\mu C/cm^2$ or more, for example, a low dosage is selected as an adjusted dosage to control the "occurrence of the proximity effect between uneven parts caused by the forward scattering electrons" in the present invention.

A requisite of the present invention is to control the occurrence of the proximity effect between the uneven patterns caused by the forward scattering electrons in the resist layer by adjusting the dosage, and "a dosage adjusted and selected" is also referred to as "a low dosage" hereinbelow.

Furthermore, when the electron beam irradiation is performed at a low acceleration voltage, the processed depth becomes shallow. However, a processed line width tends to broaden because the energy of the forward scattering electrons achieves a state of easy storage as described above. On the other hand, a method that is capable of processing a fine line width of 200 nm or less as the processed line width is highly sought after.

Here, as a specific example, an electron microscope photo of the resist layer when a line pattern of the designed value 200 nm is formed by applying an electron beam with a dosage of 500 $\mu C/cm^2$ with the acceleration voltages of 1 kV, 2 kV, and 3 kV using Accuglass SOG512B (manufactured by RASA Industries, LTD.) as a resist, is provided in FIG. 1. The processed depth and processed line width at that time are shown in Table 1 below.

TABLE 1

|  | 1 kV | 2 kV | 3 kV |
|---|---|---|---|
| Depth (nm) | 62.7 | 156.8 | 266.6 |
| Line width after development (nm) | 575 | 500 | 390 |

As shown in the photo in FIG. 1 and Table 1, a state is evident in which the lower the acceleration voltage is, the shallower the processed depth becomes, and the broader the line width after development becomes. This result agrees with supposition that the energy of the forward scattering electrons becomes easily stored at the surface of the resist layer, and the line width after development is thought to be broadened by the stored energy.

Then, in order to obtain a desired processed line width of 200 nm or less, it is a necessary to prevent the energy of the forward scattering electrons from accumulating or to prevent the line width from broadening more than necessary by development of the resist layer even if the energy of the forward scattering electrons is stored.

Due to the present inventor's intensive research, it was found that the dosage has to be 400 μC/cm$^2$ or lower in order to obtain a processed line width of 200 nm or less in the condition where the processed depth formed by the acceleration voltage of 1 to 3 kV is shallow. If the dosage is 400 μC/cm$^2$ or lower, a processed line width of 200 nm or less can be formed even if the processed depth is near the surface of the resist layer.

As described above, the line width formed by processing by the electron beam irradiation using a low acceleration voltage (an actual value) becomes a broad width in many cases that greatly deviates from the width actually irradiated due to the influence of the forward scattering electrons.

When performing a fine processing, it is generally practical to perform the processing by providing a plurality of lines and a space between the lines. However, when a line is formed of which deviation from the designed value is too large, not only does the line spread out to a space portion, but the formed line may also overlap with an adjacent line in some cases.

Therefore, the irradiation conditions of the present invention such that the dosage is 400 μC/cm$^2$ or lower and the acceleration voltage is from 1 to 3 kV not only make the formation of a single line pattern possible, but are also designed to avoid the formation of an inconvenient pattern state of a plurality of lines as described above and to enable the processing of a line width of 200 nm or less.

According to the results of the investigation by the present inventor, the enlarging power (the line width magnification) of the actual value to the designed value is practically about 1 to 2.5 times, and when it exceeds 2.5 times, it is confirmed that the above-described inconvenient pattern state tends to easily occur.

FIG. 2 shows the relationship between the designed value of the processed line width and the line width after development (an actual value) and FIG. 3 shows the relationship of the designed value and the ratio of the actual value to the designed value (the line width magnification) in the case of performing irradiation by fixing the acceleration voltage to 3 kV at each dosage of from 80 to 400 μC/cm$^2$ using Accuglass SOG512B (manufactured by RASA Industries, LTD.) as a resist of sample 2-2 in the example described later as a specific example.

FIG. 2 shows that a line width of 200 nm or less is formed against all designed values when the dosage is 400 μC/cm$^2$ or lower, and that a line width of 200 nm or less cannot be formed when the designed value is set to 90 nm in the case of 500 μC/cm$^2$.

FIG. 3 shows that a plurality of lines can be formed with all line width magnification being 2.5 or less and that this is practical when the dosage is 400 μC/cm$^2$ or lower. However, it shows that there is a case that the line width magnification exceeds a practical limit value of 2.5 in the case of 500 μC/cm$^2$.

Therefore, when using an acceleration voltage of 3 kV, the dosage is preferably simply 400 μC/cm$^2$ or lower in order to make the formation of a single line pattern or a plurality of line patterns with a line width of 200 nm or less possible and, in particular, further preferably 200 μC/cm$^2$ or more.

The case of fixing the acceleration voltage to 3 kV is explained above. When the acceleration voltage is 1 to 3 kV, the line width is the narrowest in the case of 3 kV and spreading of the forward scattering electrons becomes large, and the line width formed tends to become broader as the acceleration voltage becomes lower.

Therefore, a line width of 200 nm or less can be formed in the case of 400 μC/cm$^2$ or lower using an acceleration voltage of lower than 3 kV, for example 1 kV or 2 kV. However, in the case of 500 μC/cm$^2$, there are cases when a line width of 200 nm or less cannot be formed, and it is confirmed that the line width magnification becomes yet broader.

An operation of adjusting and determining the dosage to improve the above-described processing precision (that is, an operation of determining the dosage to obtain a desired processing line width) in the present invention is not especially limited. However, one example is given below.

(1) A region in the line-width and depth direction that may easily dissolve with respect to a developing liquid is estimated by analyzing the degree of spreading of the secondary electrons (forward scattering electrons) and predicting the resolution with a Monte-Carlo simulation from the conditions of the electron beam irradiation (electron beam current and acceleration voltage).

(2) The electron beam is applied to the resist with the conditions confirmed in (1).

(3) After the irradiation of (2), the resist is developed using a developing liquid, and the degree of the formed pattern is measured and confirmed by observing the degree of the development.

(4) If the pattern formed in (3) is as expected, its dosage is used, and if it is not, an appropriate dosage is calculated by repeatedly performing the necessary steps of (1) to (3).

In this way, data of the designed value and the actual value are stored in advance, and the 3-D mold having a desired depth and line width can be manufactured using these data in the present invention.

In the present invention, spreading of the processed line width due to storage of the energy of the forward scattering electrons is suppressed using a low dosage under the condition of using a low acceleration voltage without any occurrence of the backscattering electrons.

As long as the acceleration voltage and dosage are within the above-described range, the processing can be performed by fixing the acceleration voltage to a specific value within the range of the present invention and changing the dosage within the range of the present invention and also by changing the acceleration voltage within the range of the present invention and fixing the dosage to a specific value within the range of the present invention, depending on the desired uneven pattern, as the conditions of the electron beam irradiation in the present invention, and, in particular, it is possible to perform the fine processing to an uneven depth typical of a 3-D mold.

With such method of fine processing, manufacturing of the 3-D mold becomes possible in which the depth control is about 10 nm or less and the fine line width is controlled to 200 nm or less, and according to the experiment of the present inventor, a 3-D mold that is depth-controlled to about 6 nm and a 3-D mold in which the fine line width is controlled to 30 nm are obtained.

Moreover, "depth control" does not mean an absolute value from the resist surface to the bottom of the pattern, but means the difference in height of unevenness formed on the resist layer, that is the height gradation of unevenness formed on the resist layer.

Because such precise depth control is possible and the processing of the fine line width can be performed even near the resist surface layer in the production method for a 3-D mold of the present invention, a 3-D mold having dimensions that could not be obtained with the conventional method can be obtained. Further, because the resist layer can be effectively used up to the surface thereof, the resist layer can be used without waste. Therefore, it is not necessary to forming the resist layer to an unnecessary thickness, and the amount of resist used can be reduced.

The production method for a 3-D mold made by providing the resist having an uneven part on a substrate in the present invention has a step of irradiating an electron beam to the resist layer of an object of processing having the resist layer on the substrate and a step of forming an uneven part at the resist layer by developing the resist layer after irradiation with the electron beam.

Manufacturing steps for a 3-D mold are shown in (1) to (3) of FIG. 4. FIG. 4 has a resist layer forming step, an irradiation step, and a developing step. Moreover, in FIG. 4(2), backscattering is considered to occur because the electron beam reaches the substrate in the right-hand side pattern.

1-1. Production of an Object of Processing Having a Resist Layer on a Substrate

A resist layer manufactured separately and independently before performing an electron beam irradiation step is used in an object of processing having the resist layer on the substrate, or a resist manufactured in the resist layer forming step which is one step in a series of steps including the resist layer forming step, the electron beam irradiation step, and the developing step are performed one by one, may be used.

The resist layer forming step, which is one step in a series of steps, is explained below.

First, a resist is applied on a substrate 10. The resist may be either negative or positive. However, a polysiloxane-based material is used in the present invention in view of the fact that resistance to oxygen etching is high, resolution is high, and the control of the direction of the processed depth (analog property) is good.

A polysiloxane-based material that is conventionally known in general is applicable, and examples thereof include an inorganic material such as a silicate, hydrogen siloxane, ladder hydrogen silsesquioxane, hydrogen silsesqioxane: HSQ, hydrogen alkysilsesquioxane: HOSP, a material having an organic group such as methyl siloxane known as Accuglass 512B, and ladder methyl silsesquioxane.

Further, when using the polysiloxane-based material, the resist layer (SOG) in which unevenness is formed can be used as a mold for molding of a fine-pattern molded product as it is without peeling away the resist. Therefore, the operation of peeling away the resist becomes unnecessary and the operation of manufacturing is simplified.

The method of applying the resist may be any method, and a soaking method, a spin coating method, a vapor deposition method, a spraying method, or the like can be applied. However, a spin coating method is preferable because the thickness of the coating film is easily controlled. An organic solvent such as acetone, methanol, ethanol, toluene, isopropyl alcohol, xylene, methylisobutylketone, tetrahydrofuran, and butanol can be applied, more preferably isopropyl alcohol, acetone, ethanol, or butanol is used.

Next, a fixed amount of the solvent is removed by baking the coated resist. The preferred range of the baking temperature differs depending on the type of the resist and the solvent. However, the baking temperature is an extremely important factor in manufacturing a 3-D mold with high precision. The baking temperature is preferably 350° C. or higher, more preferably 350 to 550° C., and further preferably 400 to 450° C. The baking time is preferably 10 to 300 minutes, and preferably 30 to 120 minutes.

The film thickness of the formed resist layer 20 is a thickness at which backscattering does not occur depending on the size of the acceleration voltage of the electron beam and, while not especially limited, is preferably 20 nm to 10 µm, more preferably 100 nm to 1.2 µm, and further preferably 200 nm to 600 nm. When the film thickness exceeds 10 µm, it is difficult to obtain a uniform resist film thickness, and when thinner than 20 nm, it is difficult to spin-coat uniformly. Further, in the case of a thin film thickness, it is difficult to adjust the acceleration voltage so that backscattering is not generated after irradiation.

1-2. Irradiation Step

After baking, an electron beam is applied.

The acceleration voltage of an electron beam in the present invention is specified at from 1 to 3 kV on the condition that backscattering electrons are not generated, and an extremely low range is applied.

The dosage of an electron beam in the present invention is specified at 400 µC/cm$^2$ or lower. In the case that the dosage exceeds 400 µC/cm$^2$, "an occurrence of the proximity effect between uneven parts (also referred to as uneven patterns) caused by the forward scattering electrons" is easily generated, the energy of the forward scattering electrons becomes easily stored, and the line width control becomes difficult. In particular, this tendency becomes high at the surface of the resist near an irradiation point, the processed line width becomes broad, and the edge part of the pattern tends to be rounded.

The selection and adjustment of the dosage in the present invention is important for not only the depth control but also the line width control.

For the depth control, the dosage is preferably 300 µC/cm$^2$ or lower, more preferably 80 to 200 µC/cm$^2$, and further preferably 100 to 200 µC/cm$^2$. In the case of 100 to 200 µC/cm$^2$, in addition to the line width control being favorable, the relationship between the processed depth and the acceleration voltage becomes linear, and the processed depth control becomes good when the acceleration voltage is changed.

When changing the resist material, it is preferable to change the dosage appropriately.

Moreover, in the present invention, the exposure time can be reduced because the dosage is as low as 400 µC/cm$^2$ or lower. On the other hand, when the dosage exceeds 400 µC/cm$^2$, the exposure takes a long time and there are cases when several weeks are necessary per one exposure time. Further, there are cases when the relationship of the processed depth to the acceleration voltage and the dosage deviates from a linear function and linearity becomes poor.

The electron beam diameter is preferably 10 nm or less, and more preferably 3 nm or less. The lower limit of the beam diameter is not especially limited as long as the beam diameter can be narrowed down.

The processed depth can be changed by fixing the dosage and changing the acceleration voltage. However, because the processed depth changes with the dosage also, the acceleration voltage is preferably adjusted in balance with the dosage in order to achieve the objective remaining depth.

In the same manner, the width of the part remaining after developing the resist layer can be adjusted by adjusting the dosage. However, because the width also changes with the acceleration voltage, the dosage is preferably adjusted in balanceing with the acceleration voltage in order to achieve the objective remained width.

In order to obtain a 3-D mold with high precision by fixing the acceleration voltage and changing the dosage, the dosage is preferably 20 to 400 $\mu C/cm^2$, and especially preferably 20 to 300 $\mu C/cm^2$ and the acceleration voltage fixed at 1 to 3 kV.

When performing the electron beam irradiation by fixing the acceleration voltage and changing the dosage in such a manner, when the dosage is increased at an increment of a specific value between 15 and 40 $\mu C/cm^2$, for example, 20 $\mu C/cm^2$, a 3-D mold having a step structure with finely controlled high processed depth precision can be produced.

On the other hand, in order to obtain a 3-D mold with high precision by fixing the dosage and changing the acceleration voltage in the present invention, the dosage is preferably 20 to 400 $\mu C/cm^2$, and especially preferably 20 to 300 $\mu C/cm^2$ with the acceleration voltage fixed at 1 to 5 kV.

When performing the electron beam irradiation by fixing the acceleration voltage and changing the dosage in such a manner, when the dosage is increased at an increment of a specific value between 15 and 40 $\mu C/cm^2$, for example, 20 $\mu C/cm^2$, a 3-D mold having a step structure with finely controlled high processed depth precision can be produced.

For example, when the acceleration voltage is changed with an increment of a specific value of 30 V or lower, an uneven part can be formed on the resist layer with a height gradation from the substrate at increments of a specific value of 6 nm or less.

The line width can also be precisely formed to be 100 nm or less and, further, 80 nm or less, to be proportional to the electron beam diameter by adjusting the electron beam diameter, and to be about 10 nm depending on the adjustment. The electron beam diameter can be focused to about 3 nm, and can process the resist layer with a line width of nano order.

However, in order to make the electron beam diameter fine, it becomes necessary to decrease the beam current, requiring more time, which ultimately results in reduced production efficiency. Further, adjustment to the desired electron beam diameter requires a difficult and complicated operation. Therefore, the objective processed line width can be preferably obtained by fixing the electron beam diameter as far as possible at a minimum value and then adjusting the dosage, or the like.

1-3. Development Step

After irradiation with an electron beam, the resist layer is developed. In the case of a positive resist, the exposed part is removed by the development, and in the case of a negative resist, the non-exposed part is removed by the development. In the case of SOG, either of positive and negative can be shown depending on the dosage.

In the present invention, when the adjusted and selected dosage is 400 $\mu C/cm^2$ or lower, when SOG is used with this condition, it functions as a positive resist. However, depending on the conditions, it can function as a negative resist.

The development may be performed with a developing liquid, or may be performed with a thermal desorption treatment.

A hydrofluoric acid buffer solution etc. can be used as the developing liquid, and the developing time is preferably 30 to 300 seconds, and further preferably 60 to 120 seconds.

In the case of development by a developing liquid, a development method such as a soaking method, an atomization method on a spin coater, or a spray method can be applied. After performing the development with a developing liquid, rinsing is performed with purified water.

Development by a thermal desorption treatment can be applied. The resist layer is developed by forming holes on the surface of the resist layer by heating the resist layer onto which an electron beam is irradiated and enlarging the area of the holes.

2. 3-D Mold

"3-D" of the 3-D mold in the present invention means an uneven part where there is a difference in height (depth) or width in a plurality of processed parts of the mold.

The 3-D mold in the present invention is a 3-D mold made by providing a resist layer on a substrate and having a processed part in which the height gradation of the resist layer from the substrate is 8.0 nm or less. Further preferably, the 3-D mold has a processed part in which the height gradation of the resist layer from the substrate is 6.0 nm or less. Such a 3-D mold can be obtained with the above-described production method.

Diamond, silicon carbide, silicon, glass, sapphire, a resin, or the like can be used for a substrate.

Because diamond has superhigh hardness, a long lifetime and no deformation by pressure are expected when an imprint is repeatedly performed. Further, because diamond has a low coefficient of thermal expansion, a precise pattern transfer with a small dimensional change of the mold including the substrate can be predicted in the case of an imprint having a heating step. Furthermore, because chemical resistance is high, cleaning can be performed even when the mold gets dirty, and various advantages can be predicted such as minimum damage to the mold in the cleaning step.

When using diamond as a substrate, the same fine processing is possible on any of natural diamond, bulk diamond by a high-temperature high-pressure synthesis, or a diamond film by a gas-phase synthesis. In the case of diamond by a gas-phase synthesis, a diamond crystal oriented to a (111) or a (100) surface is preferable in the respect that uniform etching is possible. Further, the above-described diamond may be a semiconductor diamond doped with impurity elements. In the case of the semiconductor diamond, application to an electron device becomes possible. An application to tools and micromachines is possible using the high wear resistance of the diamond.

Sapphire is a material with high strength although not to the extent of diamond. Further, because it transmits an ultraviolet light, it is the most suitable material for a nano imprint having an optical curing step.

When using silicon as a substrate, it may be any of amorphous silicon and single crystal silicon. In the case of single crystal silicon, the crystal surface is not especially limited. However, it is preferable to have a (110) surface. It is the same for a silicon oxide layer and a nitride layer. With this kind of crystal surface, etching by an ion beam is favorable in the production method for a finely processed product described later.

Glass is preferably a quartz glass in view of properties such as heat resistance and transmissivity of ultraviolet rays. Similar to sapphire, this is the most suitable material for a nano imprint having an optical curing step when transmitting an ultraviolet light.

Heat resistant plastics such as engineering plastics such as polytetrafluoroethylene (PTFE), polyetherimide, cast nylon, polyacetal, and polyetheretherketone can be used as a resin for a substrate.

Further, an adhesive layer may be provided between the above-described substrate and the above-described resist layer. The adhesive layer is preferably formed with PMMA, a silane cupping agent, or a metal thin film.

When providing an adhesive layer, the thickness of the adhesive layer is preferably 0.1 to 1 nm, and preferably 2 to 10 nm.

The 3-D mold in the present invention made by providing the resist layer having an uneven part on a substrate can be used in an optical element, or the like, and examples include a Fresnel zone plate, a diffraction grating, a binary optical element, a holographic optical element, a reflection prevention film, and media such as CDs and DVDs.

Further, the 3-D mold can be used as a mold for molding of a fine-pattern molded product.

3. Method of Producing a Finely Processed Product

The method of producing a finely processed product in the present invention has a step of forming an uneven part on the above-described substrate ((4) of FIG. 4) by applying an ion beam to a 3-D mold made by providing a resist layer having an uneven part on the substrate, obtained by the above-described method of producing the 3-D mold.

Because the primary component of SOG is constituted with silicon oxide, the processing speed is low for dry etching using an oxygen ion beam. On the other hand, the primary component of materials such as diamond or plastic used for a substrate is a carbon or a hydrocarbon component, and the processing speed is high for oxygen ion beam etching. When using SOG as a mask for the oxygen ion beam by utilizing this characteristic, a 3-D pattern can be dug into the substrate when SOG is processed until it is all gone with ion beam etching.

An oxygen ion beam, an argon ion beam, $CF_4$, $CHF_3$, $SF_6$, $Cl_2$, and the like can be used as the ion beam.

In irradiation with an oxygen ion beam, an acceleration voltage of from 50 to 3000 V is preferable, and 100 to 1500 V is preferable. Microwave power is preferably 50 to 500 W, and more preferably 100 to 200 W. The flow amount of oxygen gas is preferably 1 to 10 sccm, and more preferably 2 to 5 sccm. The ion current density is preferably 0.5 $mA/cm^2$ or more, and more preferably 1 $mA/cm^2$ or more.

An argon ion beam is preferably used when the substrate is quartz.

The processed depth of the substrate can be changed by changing the acceleration voltage and the dosage. Further, a finely processed product having a processed part with a height gradation of 6 nm or less can be obtained when the acceleration voltage is changed by 30 V or lower.

4. Finely Processed Product

The finely processed product in the present invention has a processed part with a height gradation of 8 nm or less, according to the above-described method. Furthermore, it preferably has a processed part with a height gradation of 6 nm or less.

The materials of the finely processed product are explained in the substrate of the 3-D mold described above, and diamond, silicon carbide, silicon, glass, sapphire, a resin, or the like can be used.

This finely processed product can be used as a mold for molding a fine-pattern molded product that is explained next.

5. Method of Producing a Fine-Pattern Molded Product

In the method of producing a fine-pattern molded product in the present invention, the above-described 3-D mold or the above-described finely processed product is used as a mold for molding. When a resin is to be pressed to the finely processed product, the resin is softened by setting the temperature higher than the glass transition temperature of the resin, a mold is pressed to the resin, the resin is cured, and then the mold and the resin are peeled apart.

The production step of the fine-pattern molded product is shown in FIG. 5.

A resin 30 is sandwiched between a glass 40 and the mold (FIG. 5 (1)), and the resin 30 is cured (FIG. 5 (3)) while the pressure is kept constant (FIG. 5 (2)). After that, when the mold is separated, a fine-pattern molded product of the resin 30 is formed on the glass 40 (FIG. 5 (4)). In FIG. 5, a 3-D mold made by providing a resist layer having an uneven part on a substrate is used as a mold. However, a finely processed product made by forming unevenness on the substrate as described above may be used.

In the method of producing a fine-pattern molded product in the present invention, it is desirable that peeling apart of the mold and resin is favorable. When the mold is formed with an organic substance such as a resin, the peeling off of the mold becomes difficult. Therefore, a 3-D mold formed using an inorganic resist such as SOG or a finely processed product produced using an inorganic substance is preferably used as a mold.

Further, a peeling agent is preferably applied on the surface of the mold so that the mold is easily peeled off. An example of the peeling agent is a silane-coupling agent, and a metal thin film is also preferably provided to facilitate peeling. However, because the peeling agent is also peeled off when the imprint is repeatedly performed, it is preferably if it can be performed without the peeling treatment if possible. Moreover, when a finely processed product using sapphire for a substrate is used as a mold, the peelability is good.

Either of a thermosetting resin and an optical setting resin may be used for a resin to produce a fine-pattern molded product.

Examples of the thermosetting resin include an acrylic resin such as PMMA, polycarbonate, polyimide, and the acrylic resin such as PMMA is preferable.

The optical setting resin is preferably a resin is cured with ultraviolet rays, or the like, and examples include an acrylic resin, an epoxy-based resin, a urethane-based resin, and mixtures thereof.

Moreover, when using the optical setting resin, the substrate or the mold must be able to transmit light such as ultraviolet rays. On the other hand, when a thermosetting resin is used, a heating step becomes necessary and the mold is also deteriorated by heat. Therefore, it is preferable to use a resin with heat resistance.

In the case of a 3-D mold and a finely processed product using a plastic as a substrate, an imprint to a curved surface is also possible because the mold is soft. Further, because plastic is not expensive, it is also suitable for use in a disposal biochip, or the like.

6. Fine-Pattern Molded Product

The fine-pattern molded product in the present invention has a processed part with a height gradation of 8 nm or less. Preferably, it has a processed part with a height gradation of 6 nm or less.

The obtained fine-pattern molded product and 3-D mold can be used in an optical element because due to its shape and material. Examples include a Fresnel zone plate, a diffraction grating, a binary optical element, a holographic optical element, a reflection prevention film, and media such as CDs and DVDs.

EXAMPLES

Below, the present invention is specifically explained by examples. However, the present invention is not limited to these examples.

Example 1

⟨Formation of Resist Layer⟩

Sample 1 is manufactured by spin-coating Accuglass SOG512B (manufactured by RASA Industries, LTD.) including a methylsiloxane and an organic solvent (including methylisobutylketone as a primary component) on a silicon substrate at 300 rpm for 3 seconds and 3000 rpm for 10 seconds and baking at 450° C. for 60 minutes. When the film thickness of Sample 1 is measured, it is about 500 nm.

⟨Irradiation of Electron Beam⟩

An electron beam is applied to Sample 1 obtained above. In the electron beam irradiation, a scanning electron microscope ERA-8800FE (manufactured by Elionix CO., LTD.) converted so that a pattern drawn on a personal computer can be exposed, is used.

An electron beam is applied to Sample 1 by fixing the acceleration voltage to 2 kV, fixing the dosage to any of from 20 to 400 $\mu C/cm^2$, and changing the designed value of the processed line width. Moreover, the beam current at irradiation is set to 1.6 pA, and a beam diameter is fixed to 20 nm.

⟨Development⟩

Sample 1 after irradiation is soaked in a hydrofluoric acid buffer solution (HF:$NH_4F$=1:1) for 90 seconds, and then rinsed with purified water.

⟨Result⟩

The processed line width after development is measured using a scanning electron microscope ERA-8800FE (manufactured by Elionix CO., LTD.).

When the resist pattern after development obtained by fixing the acceleration voltage to 2 kV, setting the dosage to 200 $\mu C/cm^2$ and the designed value of the processed line width to 90 nm is observed with an electron micro scope and a photo, the processed line width is 140 nm.

When the resist pattern after development obtained by fixing the acceleration voltage to 2 kV, setting the dosage to 300 $\mu C/cm^2$ and the designed value of the processed line width to 90 nm is observed with an electron micro scope and a photo, the processed line width is 180 nm.

When the resist pattern after development obtained by fixing the acceleration voltage to 2 kV, setting the dosage to 400 $\mu C/cm^2$ and the designed value of the processed line width to 90 nm is observed with an electron micro scope and a photo, the processed line width is 195 nm.

When the resist pattern after development obtained by fixing the acceleration voltage to 2 kV, setting the dosage to 500 $\mu C/cm^2$ and the designed value of the processed line width to 90 nm is observed with an electron micro scope and a photo, the processed line width is 225 nm, and a line width of 200 nm or less cannot be obtained.

Example 2

When the resist pattern after development obtained by fixing the acceleration voltage to 1 kV, setting the dosage to 80 $\mu C/cm^2$ and the designed value of the processed line width to 90 nm using Sample 1 in the same manner as in Example 1 is observed with an electron micro scope and a photo, the processed line width is 110 nm.

Example 3

In Example 3 and the subsequent examples, a method of producing a 3-D mold that does not apply to the present invention is also described in the Examples to perform a comparison between the present invention and comparative examples.

⟨Formation of Resist Layer⟩

Sample 2-1 is manufactured by spin-coating Accuglass SOG512B (manufactured by RASA Industries, LTD.) including a methylsiloxane and an organic solvent (including methylisobutylketone as a primary component) on a silicon substrate at 300 rpm for 3 seconds and 3000 rpm for 10 seconds and baking at 300° C. for 60 minutes, and Sample 2-2 is manufactured by spin-coating with the same rotations and baking at 425° C. for 60 minutes. When the film thicknesses of Samples 2-1 and 2-2 are measured, each is about 500 nm.

⟨Irradiation of Electron Beam⟩

An electron beam is applied to the Samples obtained above. In the electron beam irradiation, a scanning electron microscope ERA-8800FE (manufactured by Elionix CO., LTD.) is converted so that a pattern drawn on a personal computer can be exposed, is used.

An electron beam is applied to Samples 2-1 and 2-2 by fixing the acceleration voltage to any of from 1 to 30 kV and changing the dosage between 20 and 400 $\mu C/cm^2$.

Further, an electron beam is applied to Samples 2-1 and 2-2 by fixing the dosage to any of from 20 to 500 $\mu C/cm^2$ and changing the acceleration voltage between 1 and 5 kV.

Also in the irradiation of any of the Samples, when the acceleration voltage is from 1 to 10 kV, the beam current is set to 1.6 pA and a beam diameter is fixed to 20 nm, and when the acceleration voltage is 30 kV, the beam current is set to 3.2 pA and a beam diameter is fixed to 3 nm.

⟨Development⟩

Samples 2-1 and 2-2 are soaked in a hydrofluoric acid buffer solution (HF:$NH_4F$=1:1 mixed solution) for 90 seconds, and then rinsed with purified water.

⟨Result⟩

The processed depth of unevenness formed is measured using a step measurement machine (trade name: Tencor Alpha-Step500; manufactured by KLA-Tencor Co.).

The relationship between the processed depth obtained by fixing the acceleration voltage and the dosage for Sample 2-2 having a SOG layer baked at 425° C. is shown in FIGS. 6 and 7.

FIG. 6 shows a correlation whereby the higher the dosage becomes the deeper the processed depth becomes (hereinafter, referred to as "linearity" in some cases), and the objective of controlling the processed depth of the mold in the present invention substantially continuously, in an analog fashion, and precisely, is achieved.

However, when the acceleration voltage is 5 kV, the incline increases rapidly after the dosage is about 50 $\mu C/cm^2$.

It is thought that this is because when the film thickness of the resist layer is 500 nm such as in Sample 2-2, when an acceleration voltage of about 4 kV or higher is applied, the irradiated electron passes through the resist, and as a result, backscattering electrons are generated. Due to the influence of the spread of these backscattering electrons in the resist, the sensitivity of the resist increases, the resist is easily bored into, the depth deepens rapidly, and the incline increases.

Therefore, in the example shown in this FIG. 6, a mold with far higher precision can be obtained when the acceleration voltage is 1 to 3 kV without generation of backscattering electrons than in the case of 5 kV in which the influence of the backscattering electrons is thought to exist.

Furthermore, the acceleration voltage is fixed to 5 kV, and the dosage is increased to 20 to 300 μC/cm² with an increment of 20 μC/cm². The pattern of a 3-D step structure obtained at this time is shown in FIG. 8.

As shown in FIG. 8, the depth deepens every time the dosage is increased, especially from after 60 μC/cm² until 300 μC/cm². It is clear that the pattern of a 3-D step structure having a processed depth corresponding to the dosage can be manufactured by changing the dosage in this manner. That is, the method in the present invention is extremely superior in a controllability of the line width when processing near the surface layer with an acceleration of 1 to 3 kV. However, it shows that precise depth control can also be performed when deepening the processed depth with an acceleration voltage of 5kV.

Moreover, in FIG. 8, the depth controllability is good especially in the range of 60 μC/cm² to 300 μC/cm². However, there are cases in which processing is possible even at 20 μC/cm² or 40 μC/cm² when the resist material is changed or the baking temperature is changed.

The relationship between the processed depth obtained in the case of fixing the acceleration voltage and the dosage for Sample 2-1 having a SOG layer baked at 300° C. is shown in FIG. 9. As shown in FIG. 9, it is revealed that the higher the dosage becomes the deeper the processed depth becomes, the same as when the baking temperature is 425° C.

However, the correlation of the processed depth to the dosage (linearity) is better in Sample 2-2 in the case of the baking temperature of 425° C., and the formation of three-dimensions with high precision is preferably performed at a baking temperature of 425° C. rather than 300° C.

The relationship between the processed depth obtained in the case of fixing the acceleration voltage and the dosage for Sample 2-2 having a SOG layer baked at 425° C. is shown in FIGS. 10 and 11. As shown in FIG. 10, it is found that the higher the acceleration voltage becomes the deeper the processed depth becomes.

However, a tendency is observed that linearity worsens as the acceleration voltage becomes higher, and the generation of backscattering electrons is considered to be one of the causes, the same as in the prior explanation regarding FIG. 6.

Further, in FIG. 10, the processed depth becomes deeper as the acceleration voltage becomes higher at a dosages from 60 μC/cm² to 500 μC/cm². However, when a pattern formed in the case of a dosage of 500 μC/cm² is observed, there is a case in which the line width of the pattern is larger than the expected line width. This is considered to be because "an inter-uneven part proximity effect caused by forward scattering electrons" occurs. Because the surface of the resist layer is especially close to a light source in particular, the edge part of the pattern tends to be rounded. However, when the dosage is 400 μC/cm² or lower, it is difficult for the edge part of the pattern to be rounded. Therefore, when controlling the line width precisely, it is found that the dosage is preferably 400 μC/cm² or lower.

Furthermore, in FIG. 10, it is found that the linearity in the relationship between the acceleration voltage and the processed depth is good and the control of the processed depth by the acceleration voltage is superior, when the dosage is 80 μC/cm² to 200 μC/cm².

In FIG. 11, the processed depth becomes deeper as the acceleration voltage becomes higher at dosages of 80 μC/cm² to 500 μC/cm². However, when a pattern formed in the case of a dosage of 500 μC/cm² is observed, there is a case in which the line width of the pattern is larger than the expected line width. This is considered to be because "an inter-uneven part proximity effect caused by forward scattering electrons" occurs. Because the surface of the resist layer is especially close to a light source in particular, the edge part of the pattern tends to be rounded. However, it is observed that this tendency decreases as the dosage becomes low.

Example 4

Sample 2-1 (SOG layer and baked at 300° C.) is prepared with the same method as Example 3, the irradiation of an electron beam is performed by fixing the dosage to 400 μC/cm² and changing the acceleration voltage with an increment of 30 V, and then development is performed with the same method as Example 1. The pattern of the obtained sample is measured with the same method as Example 1.

FIG. 12 is a graph showing the correlation of the acceleration voltage and the processed depth of a part of the result, where the y-axis represents the difference of the processed depth when the processed depth formed when the acceleration voltage is 2000 V is set to 130 nm as a base point with an increment of 6 nm, and the x-axis represents the acceleration voltage with 2000 V as a base point and an increment of 30 V.

Reference Example 1

⟨Development by Thermal Desorption Treatment⟩

Sample 2-1 is prepared with the same method as Example 1, and the electron beam is applied at an acceleration voltage of 10 kV and a dosage of 400 μC/cm². After that, the development is performed by increasing the temperature to 1000° C. with a temperature increase condition of 60° C./min in a muffle furnace. After that, it is cooled to room temperature, the pattern of the obtained sample is measured with the same method as Example 1, and it is processed at a depth of 30 nm.

However, because the processed depth is shallow, development with a developing liquid is desirable to obtain a deeper pattern.

Example 5

⟨Production of Finely Processed Product⟩

A quartz substrate is spin-coated with Accuglass SOG512B (manufactured by RASA Industries, LTD.) including a methylsiloxane and an organic solvent at 300 rpm for 3 seconds and 3000 rpm for 10 seconds and baking at 300° C. for 60 minutes. Furthermore, Sample 3 is manufactured by spin-coating one more layer with SOG512B (manufactured by RASA Industries, LTD.) at 300 rpm for 3 seconds and 3000 rpm for 10 seconds and baking at 300° C. for 60 minutes. The film thickness of Sample 3 is about 1200 nm.

An electron beam is applied to the obtained Sample 3. In the electron beam irradiation, a scanning electron microscope ERA-2000FE (manufactured by Elionix CO., LTD.) converted so that a pattern drawn on a personal computer can be exposed, is used. The irradiation of an electron beam is performed by fixing the dosage to 400 μC/cm² and changing the acceleration voltage from 1 to 10 kV with an increment of 1 kV, and then the development is performed with the same method as Example 1.

From this, a 3-D mold equipped with a SOG layer having unevenness on a quartz substrate is obtained. The processed depth of unevenness formed is measured using a step measurement machine (trade name: Tencor Alpha-Step500; manufactured by KLA-Tencor Co.). The result is shown in FIG. 13.

Etching is performed with an oxygen ion beam on the quartz of the substrate with an SOG layer of the 3-D mold shown in FIG. 13 as a mask. The etching is performed until the SOG mask (resist layer) disappears with etching conditions of an acceleration voltage of 300V, microwave power of 100 W, an oxygen gas flow of 3 sccm, an ion beam current density of 0.48 mA/cm2, and a process time of 90 minutes. The pattern of the quartz mold manufactured is shown in FIG. 14.

When the profile of the quartz substrate after etching is measured using a step measurement machine (trade name: Tencor Alpha-Step500; manufactured by KLA-Tencor Co.), it is found that a finely processed product of quartz (a quartz mold) corresponding to a 3-D step structure of the SOG layer is obtained.

Example 6

⟨Production of a Fine-Pattern Molded Product⟩

A fine-pattern molded product is produced using the quartz mold obtained in Example 5 as a mold for molding. PAK-01 (manufactured by Toyo Gosei Co., Ltd.) is used for an optical setting resin, the imprint pressure is set to 0.5 Mpa, and the irradiation dose of ultraviolet rays is 1 J/cm$^2$.

The pattern of the obtained fine-pattern molded product of the resin is shown in FIG. 15. It is found that the pattern is transferred faithfully corresponding to the pattern of the quartz mold in FIG. 14.

Example 7

The following experiment is performed using Sample 2-2.
⟨Irradiation of Electron Beam⟩

An electron beam is applied to Sample 6-1 obtained above. In the electron beam irradiation, a scanning electron microscope ERA-8800FE (manufactured by Elionix CO., LTD.) converted so that a pattern drawn on a personal computer can be exposed is used.

An electron beam is applied by fixing the acceleration voltage to 2 kV, setting the beam current to 1.6 pA, and the dosage to 400 μC/cm$^2$.

⟨Development⟩

Sample 6-1 is soaked in a hydrofluoric acid buffer solution (HF:NH$_4$F=1:1) for 90 seconds, and then rinsed with purified water.

⟨Result⟩

An electron microscope photo of the resist pattern formed by setting a designed value of the line width to 45 nm is shown in FIG. 16.

The pattern is processed with a depth of 140 nm and a line width of 140 nm, and the processed profile is favorable. In such way, according to the method in the present invention, it is found that the formation of a 3-D mold having a precise and fine depth and line width is possible.

BRIEF DESCRIPTION OF THE DRAWINGS

FIG. 5 is a schematic view showing the manufacturing steps of a fine-pattern molded product.

EXPLANATIONS OF LETTERS OR NUMERALS

Figure 1:
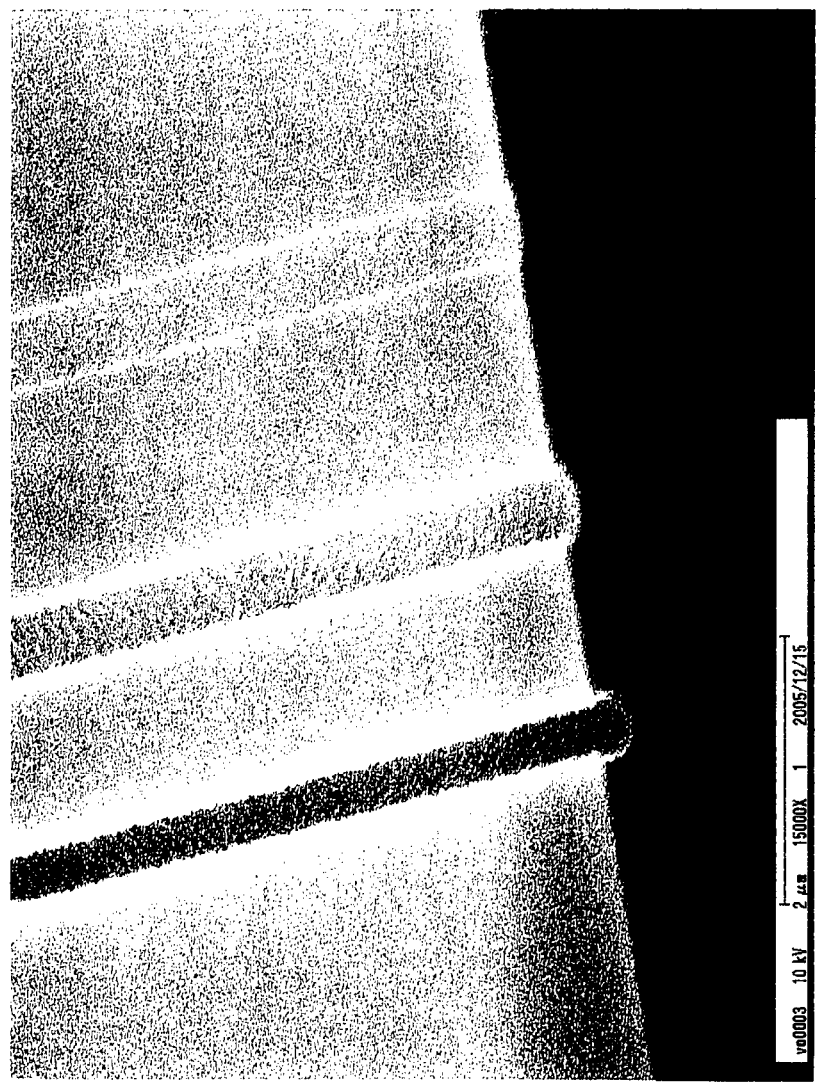
FIG. 1 is an electron microscope photo of a resist layer when a line pattern is formed with a designed value of 200 nm using Accuglass SOG512B as a resist by applying an electron beam at a dosage of 500 μC/cm$^2$ at an acceleration voltage of 1 kV, 2 kV, and 3kV.
Figure 2:
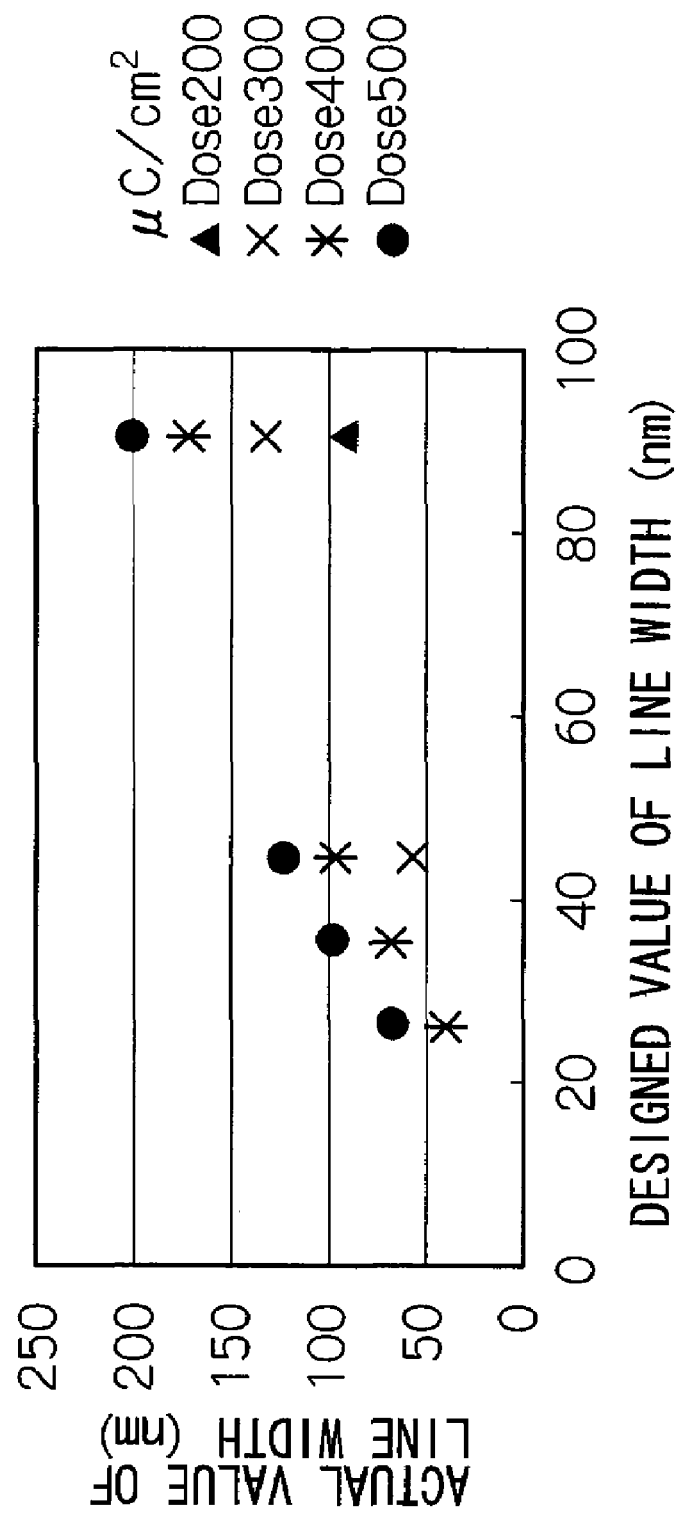
FIG. 2 is a graph showing the relationship between the designed value of the processed line width and the line width after development (an actual value) in the case of irradiating a resist layer by fixing the acceleration voltage to 3 kV and at each dosage from 80 to 400 μC/cm$^2$.
Figure 3:
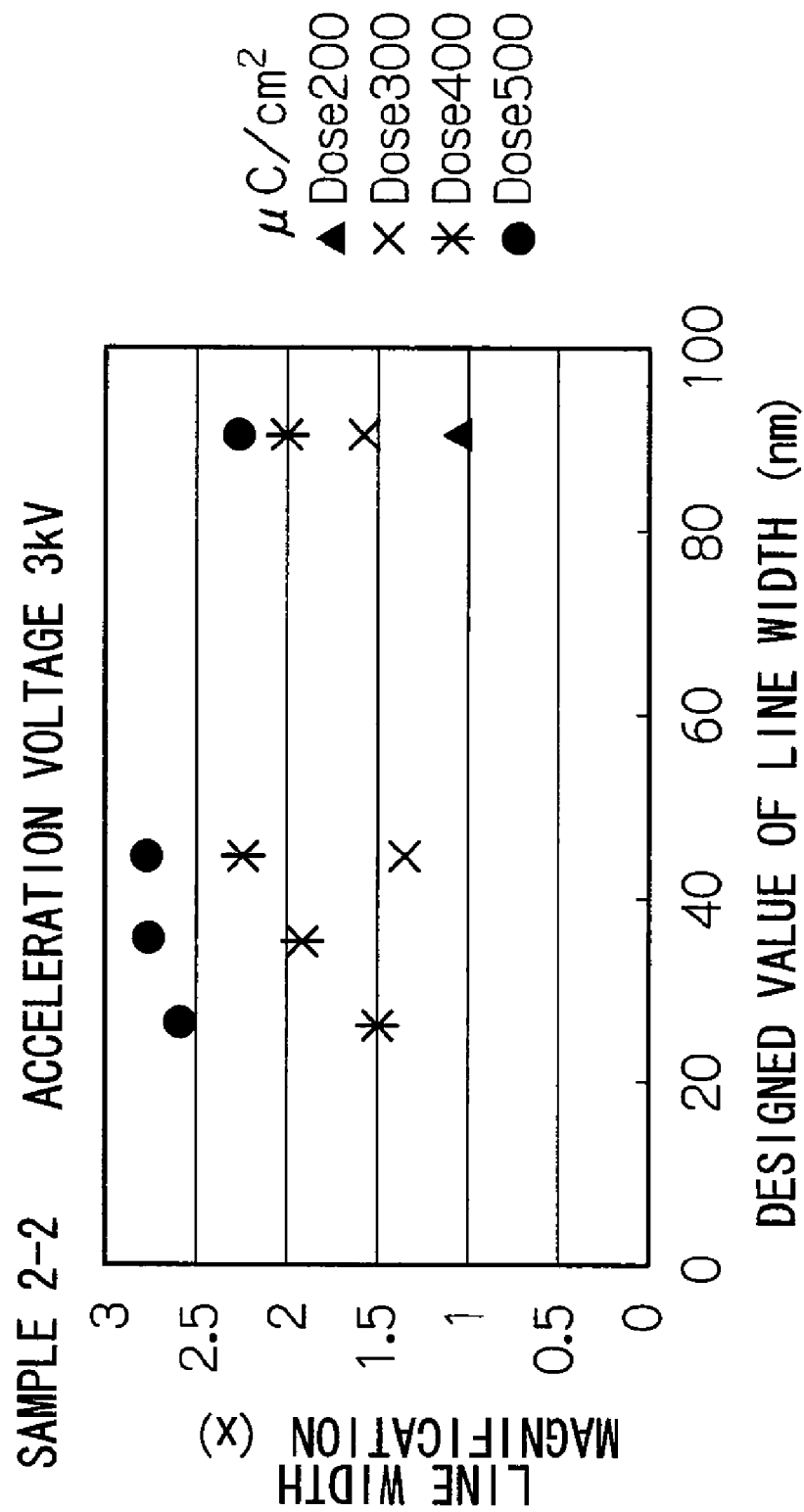
FIG. 3 is a graph showing the relationship between the designed value of the processed line width and the ratio of the actual value to the designed value (line width magnification) in FIG. 2.
Figure 4:
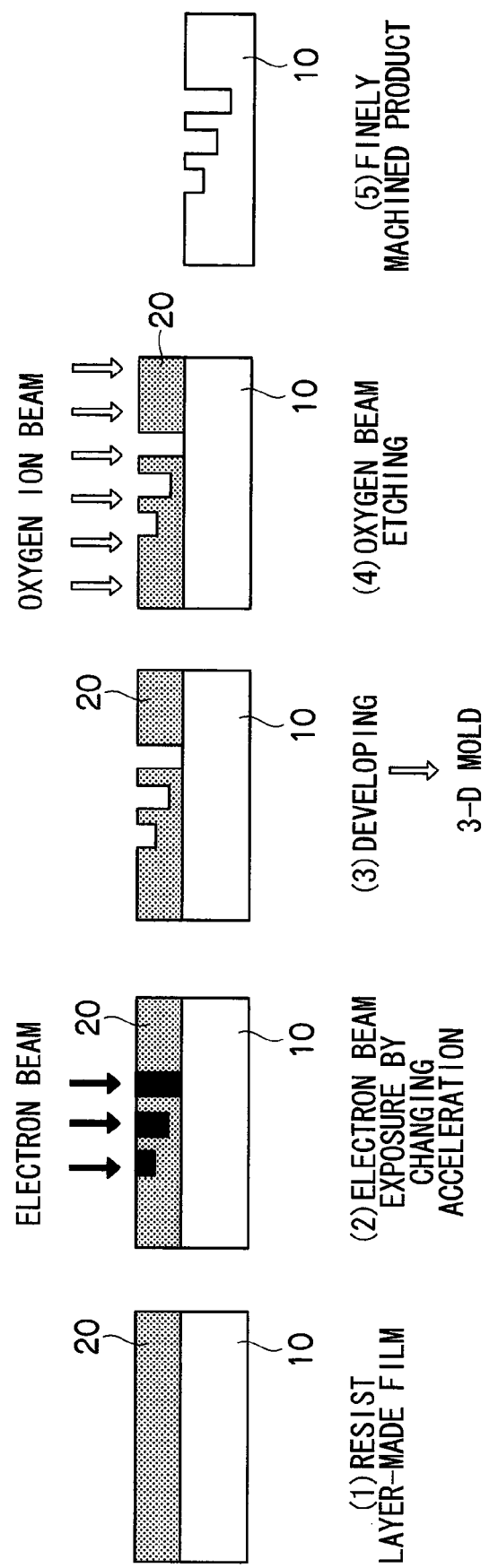
FIG. 4 is a schematic view showing the manufacturing steps of a 3-D mold and a finely processed product.
Figure 6:
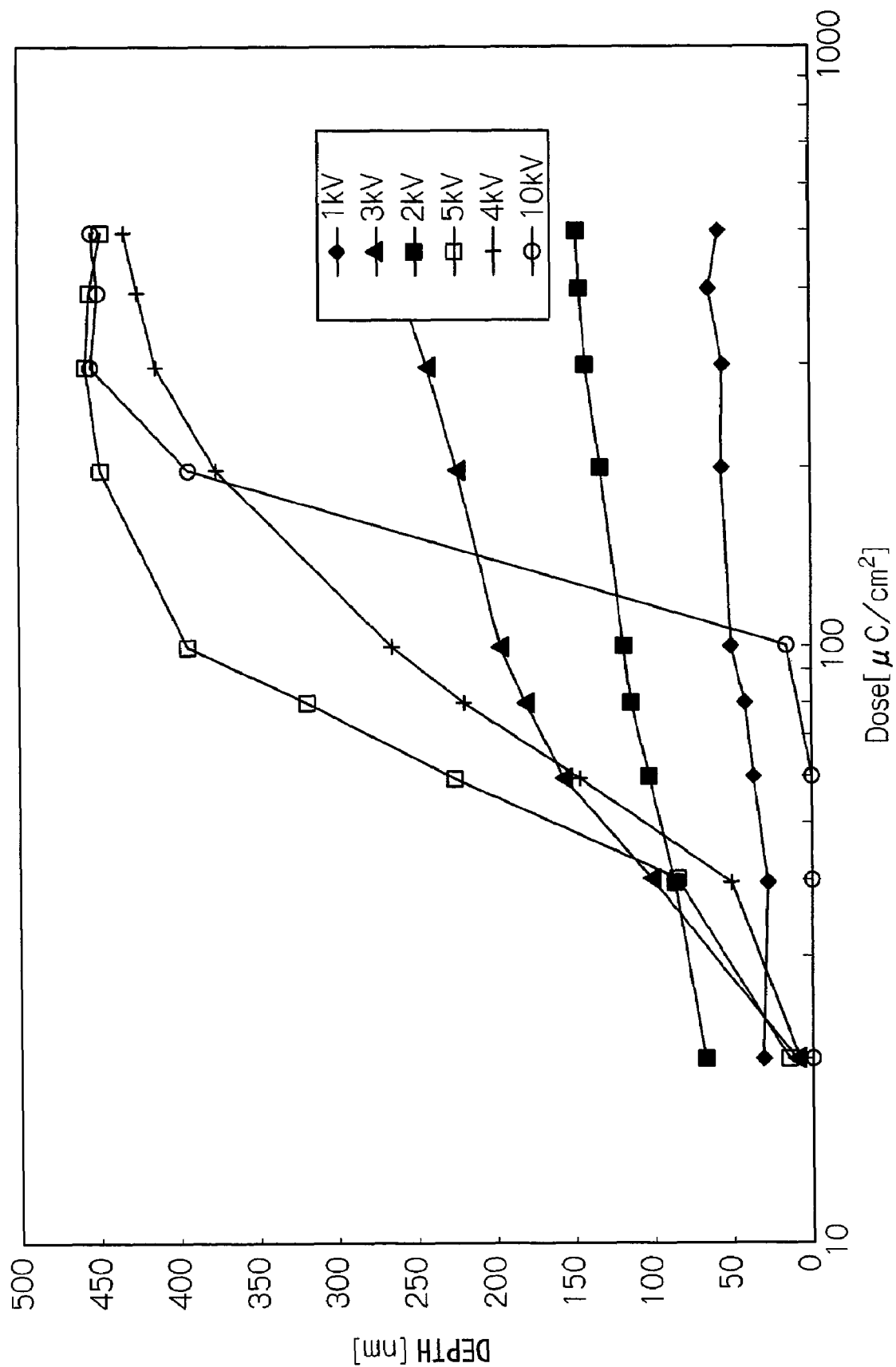
FIG. 6 is a graph showing the relationship between the processed depth obtained in the case of fixing the acceleration voltage, and the dosage as in Example 3.
Figure 7:
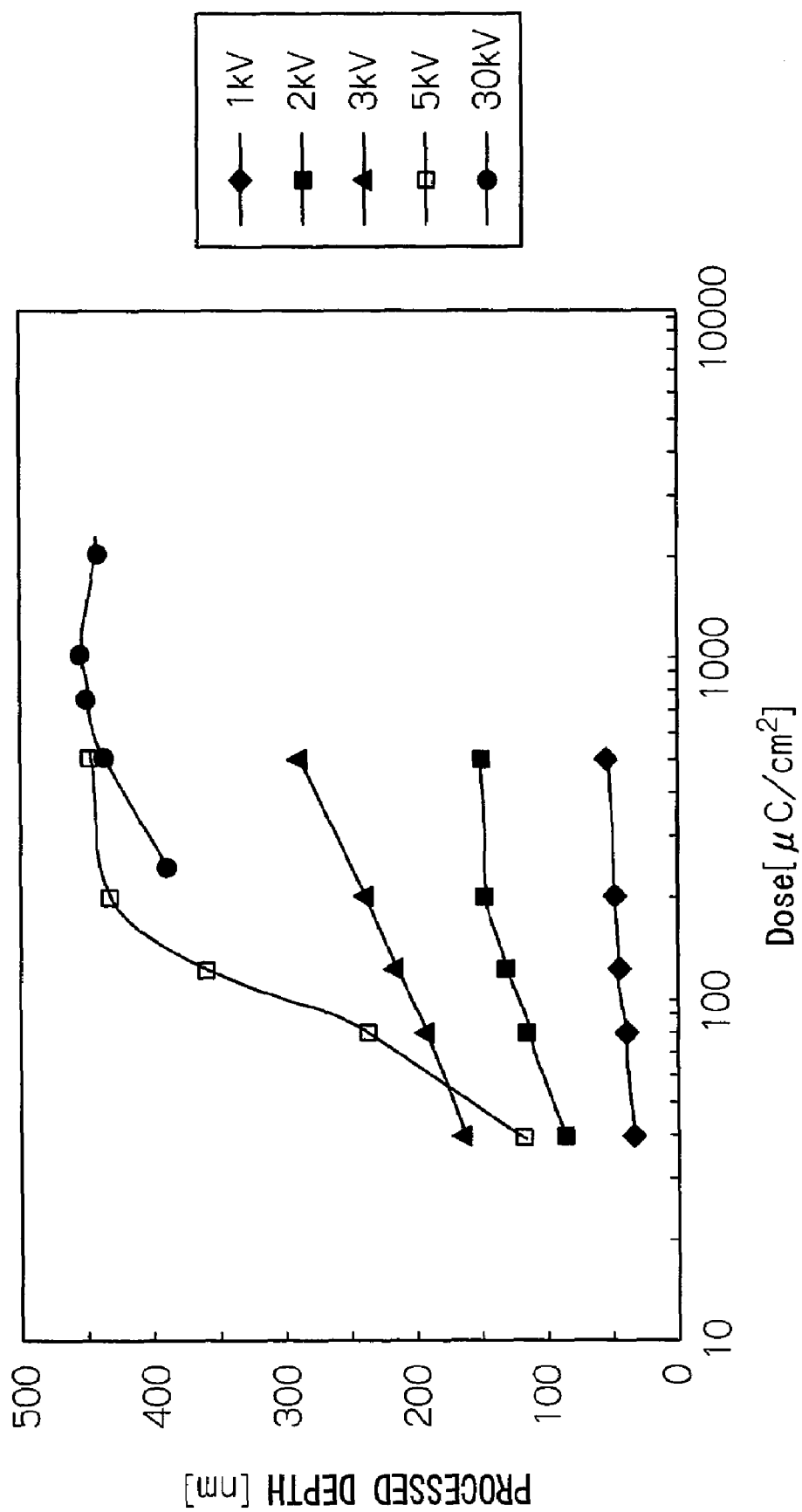
FIG. 7 is a graph showing the relationship between the processed depth obtained in the case of fixing the acceleration voltage, and the dosage as in Example 3.
Figure 8:
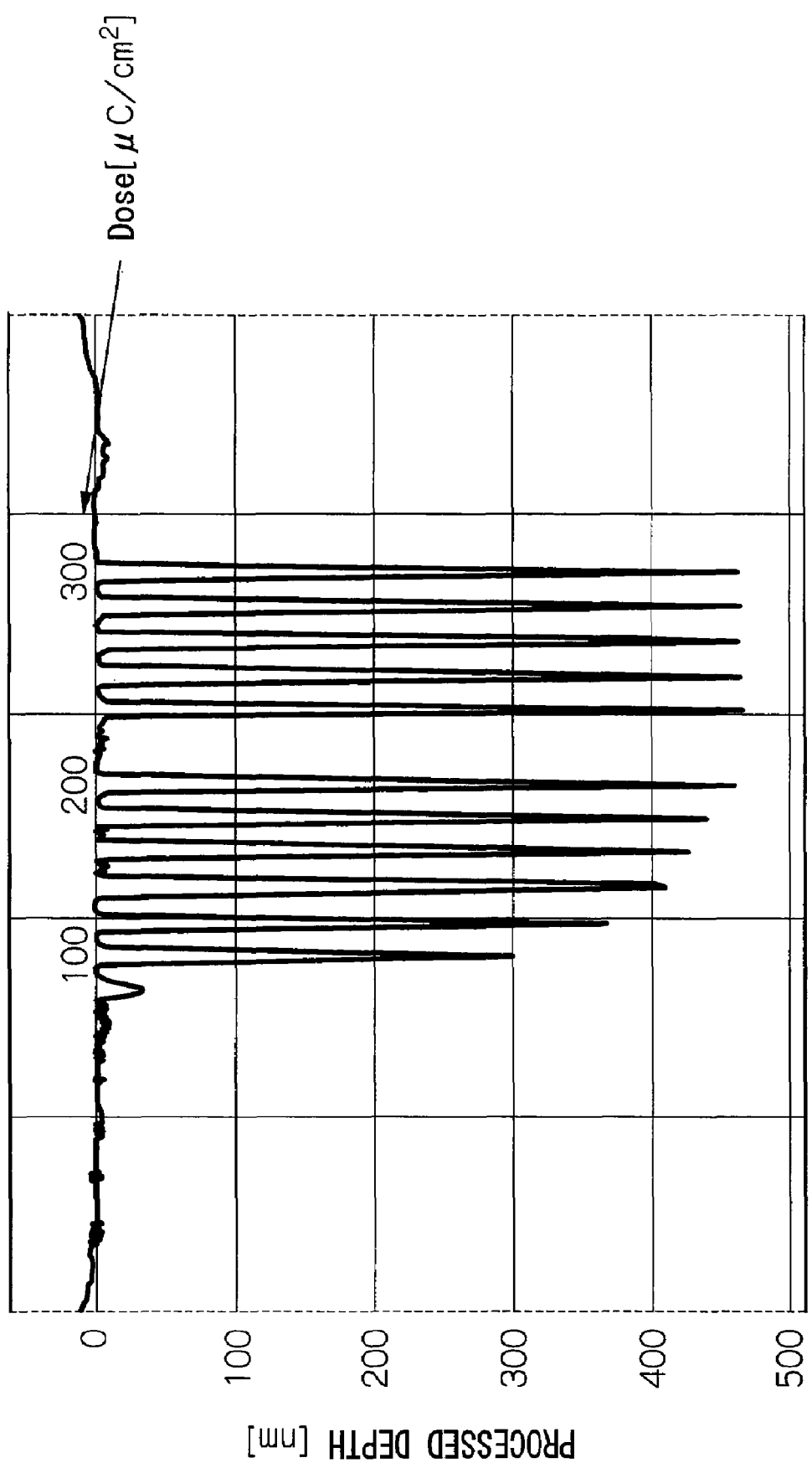
FIG. 8 is a figure showing the pattern of a 3-D step structure in the case of fixing the acceleration voltage at 5 kV and changing the dosage, with respect to an SOG layer baked at 425° C. in Example 3.
Figure 9:
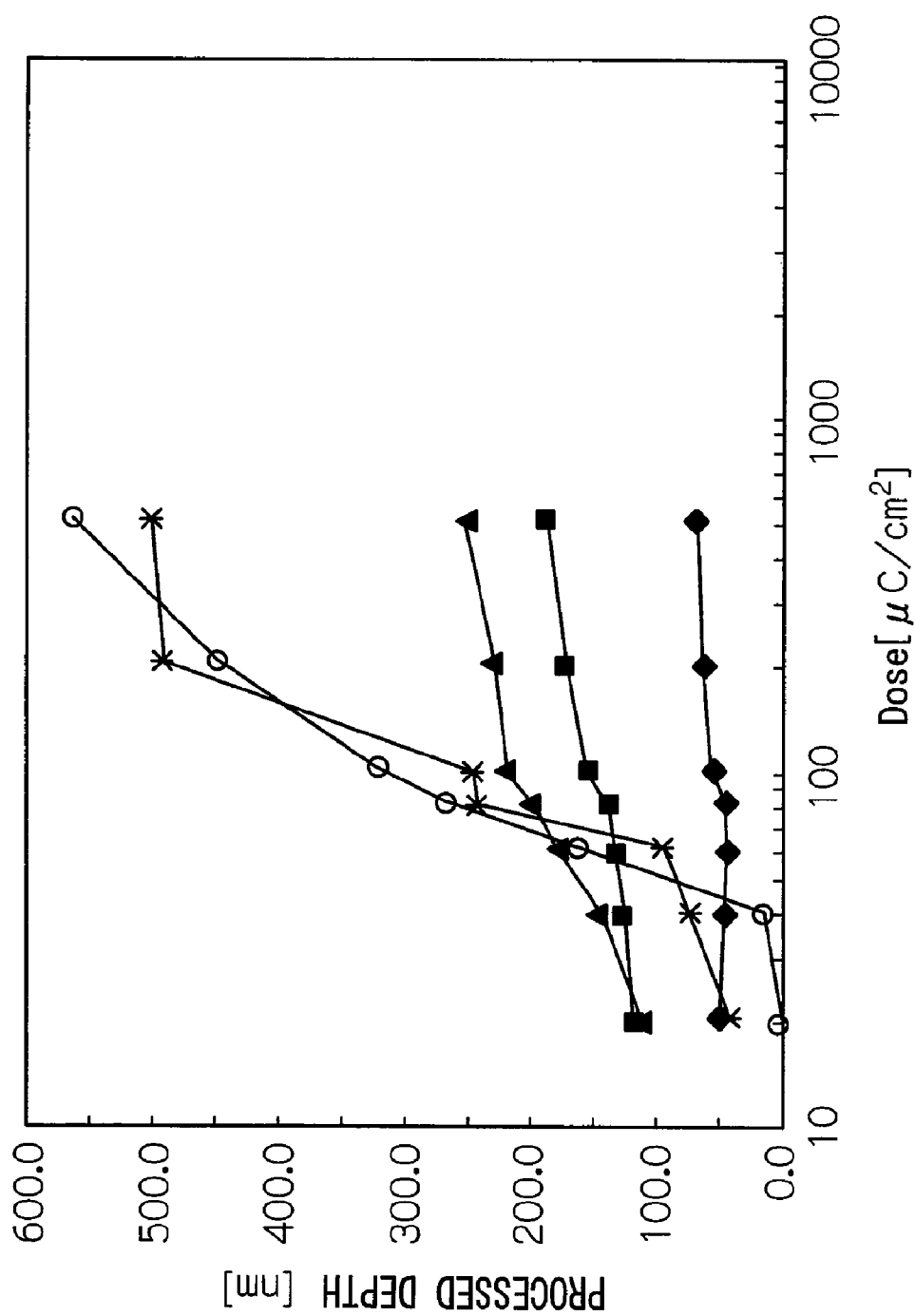
FIG. 9 is a graph showing the relationship between the processed depth obtained in the case of irradiating by fixing the acceleration voltage, with respect to an SOG layer baked at 300° C., and the dosage in Example 3.
Figure 10:
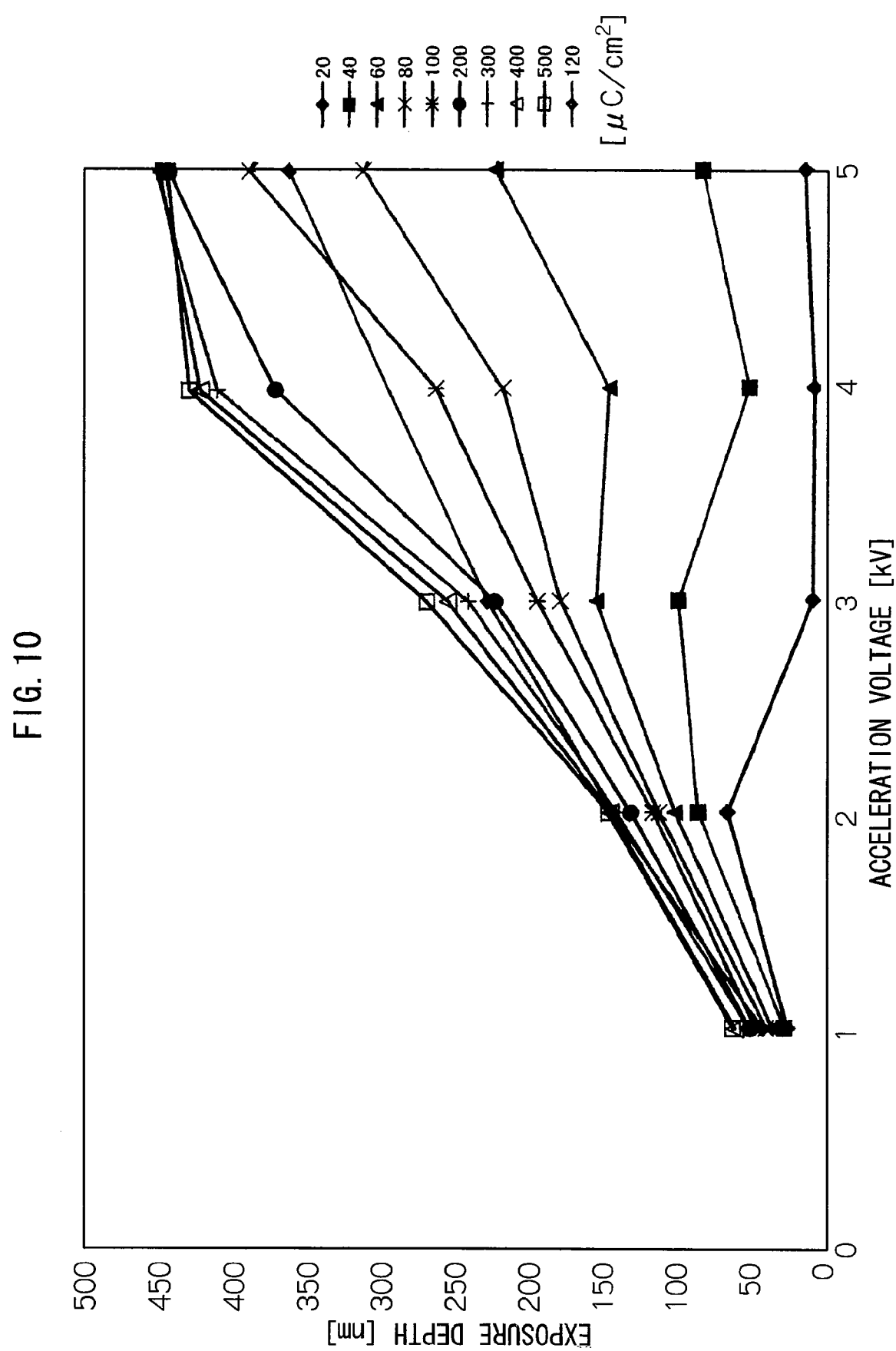
FIG. 10 is a graph showing the relationship between the processed depth obtained in the case of irradiating by fixing the dosage, with respect to an SOG layer baked at 425° C., and the acceleration voltage in Example 3.
Figure 11:
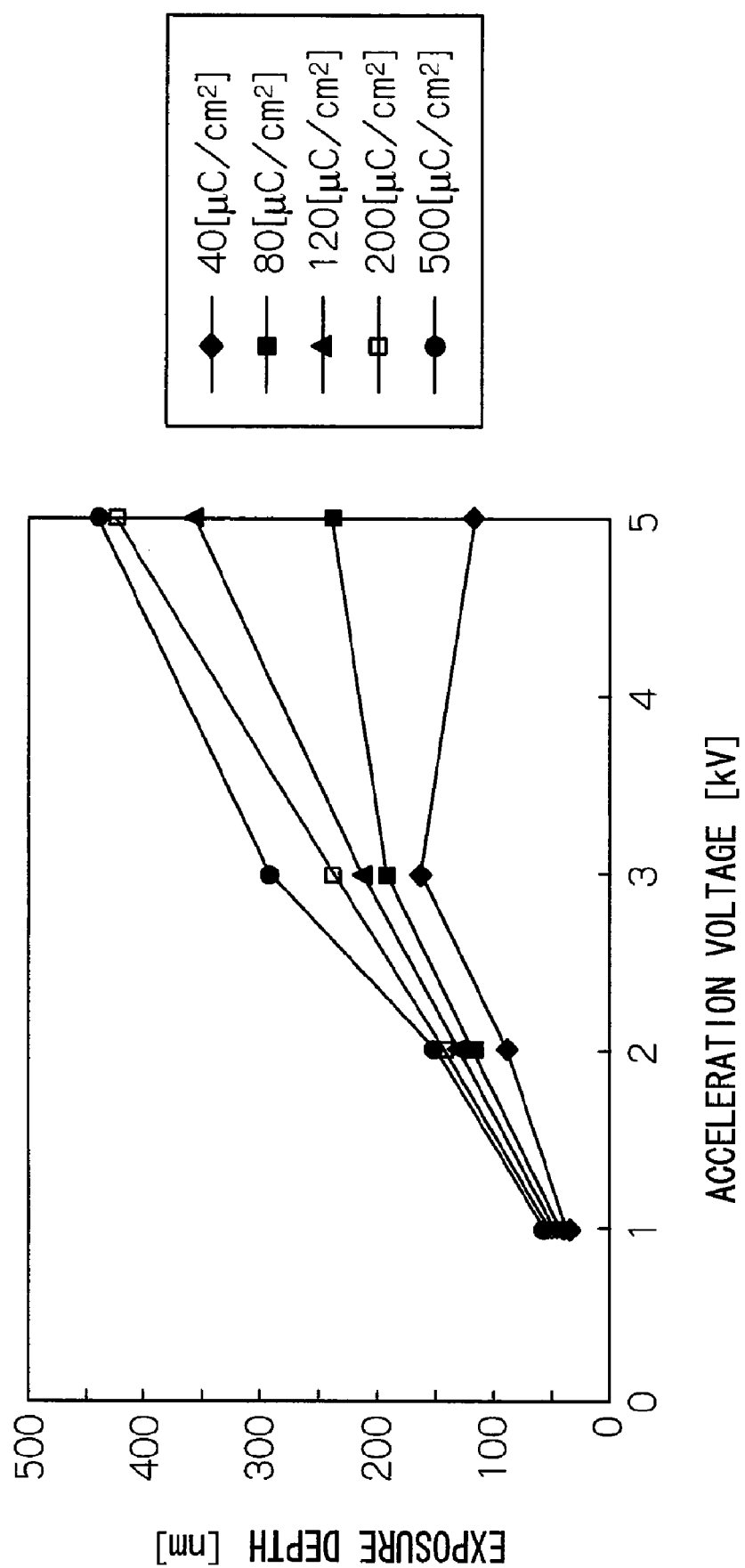
FIG. 11 is a graph showing the relationship between the processed depth obtained in the case of irradiating by fixing the dosage, with respect to an to a SOG layer baked at 425° C., and the acceleration voltage in Example 3.
Figure 12:
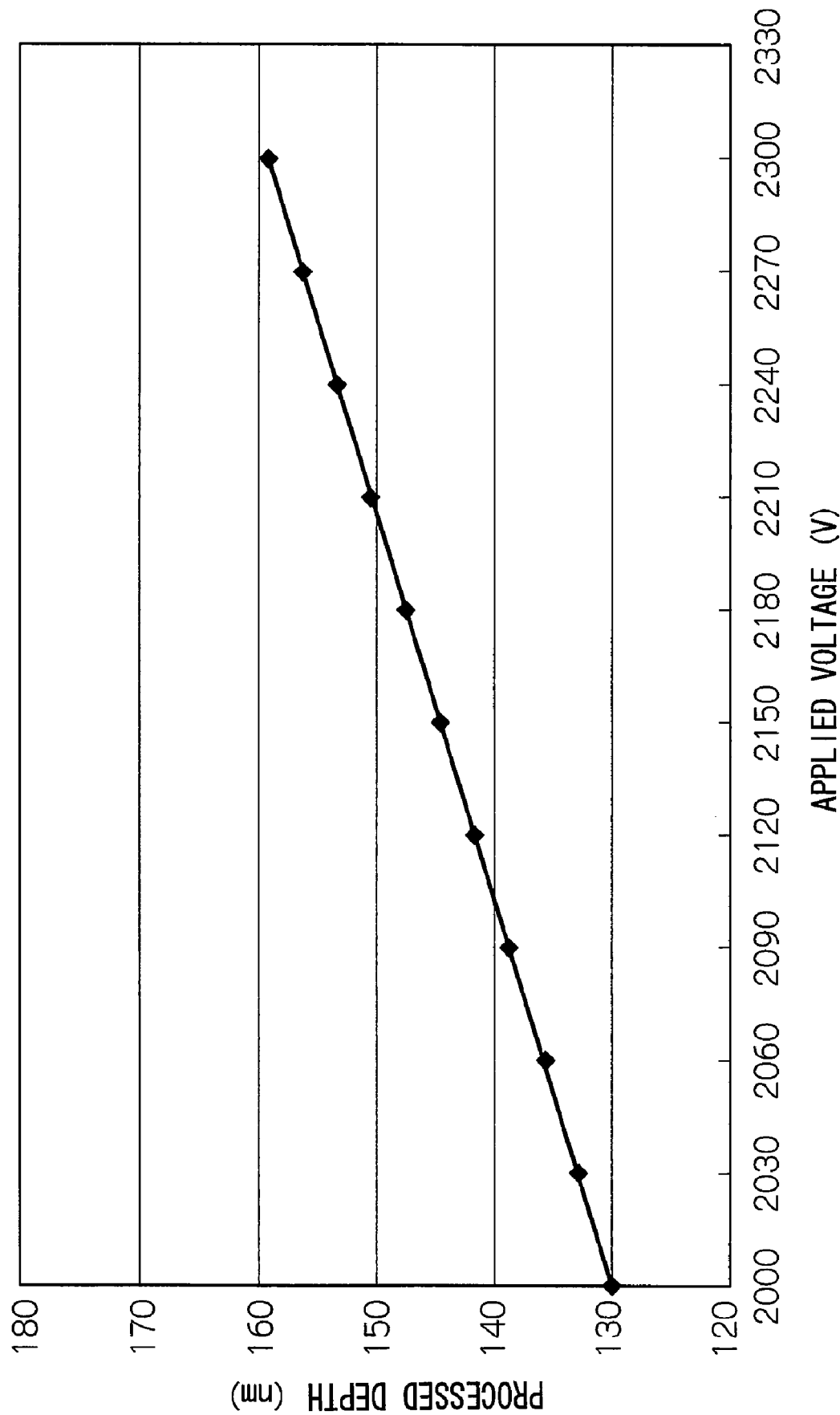
FIG. 12 is a graph showing the relationship between the acceleration voltage and the processed depth in the case of performing the irradiation of an electron beam by changing the acceleration voltage with an increment of 30V in Example 4.
Figure 13:
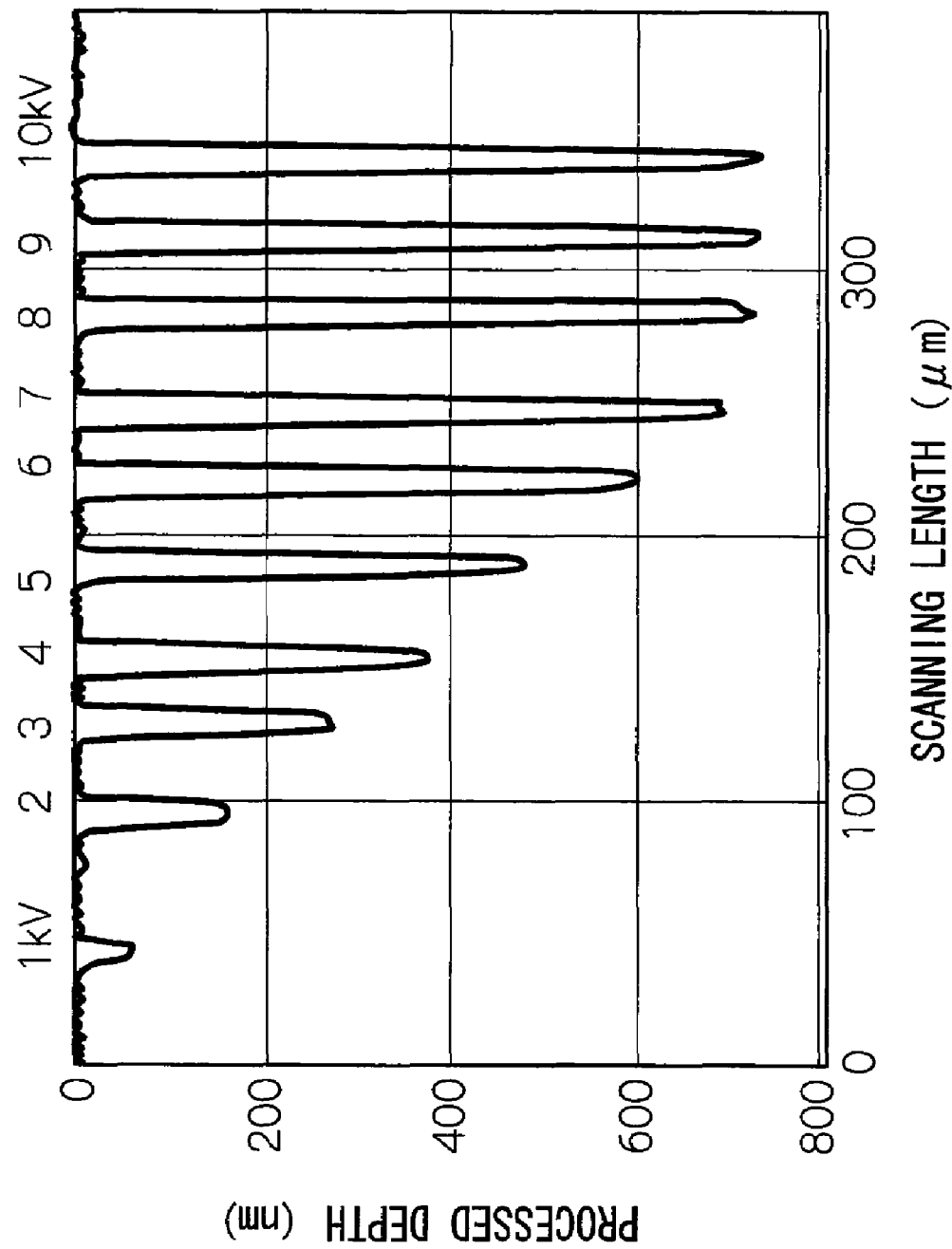
FIG. 13 is a figure showing the pattern of a an SOG layer on a quartz substrate obtained in Example 5.
Figure 14:
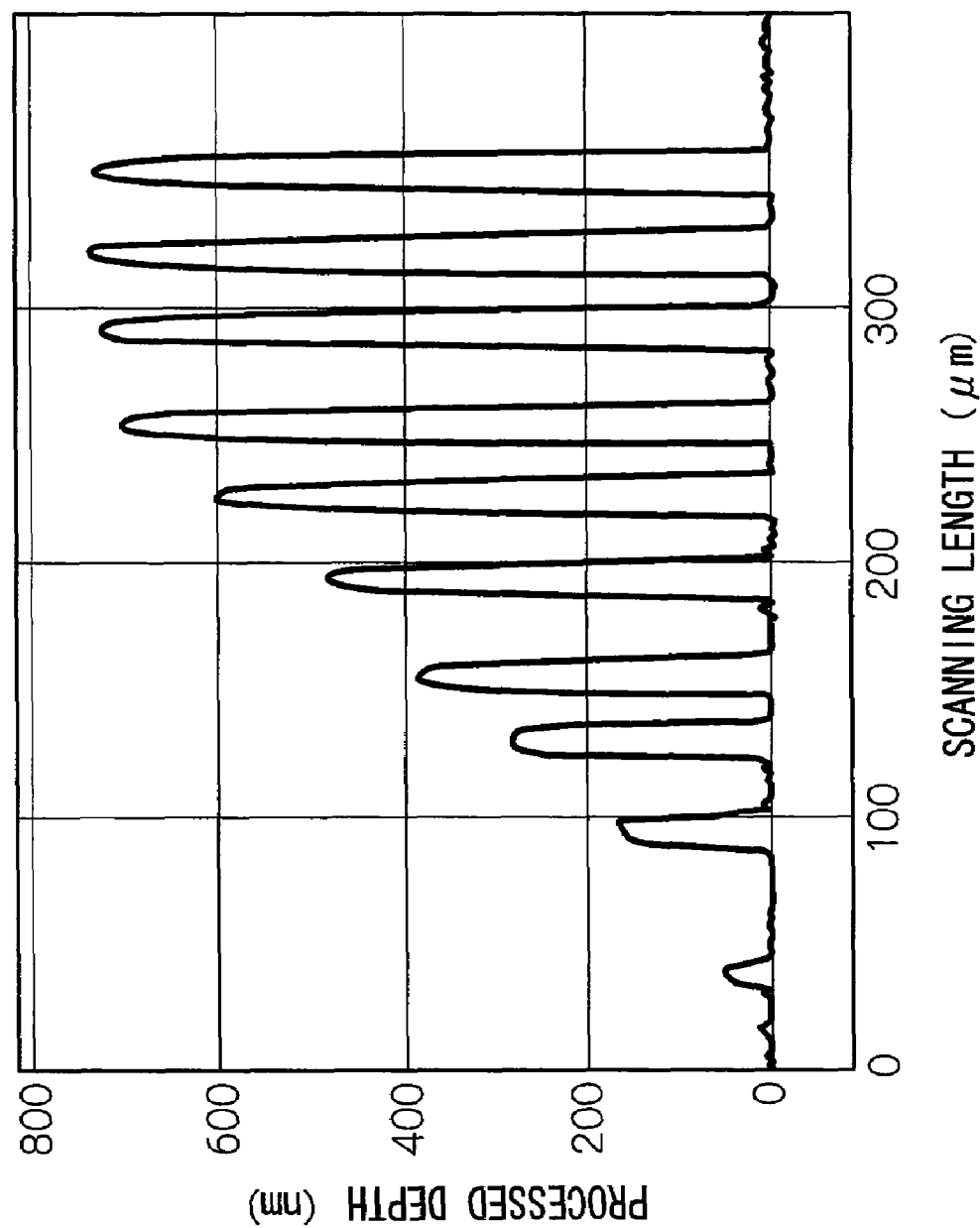
FIG. 14 is a figure showing the pattern of a quartz mold obtained in Example 5.
Figure 15:
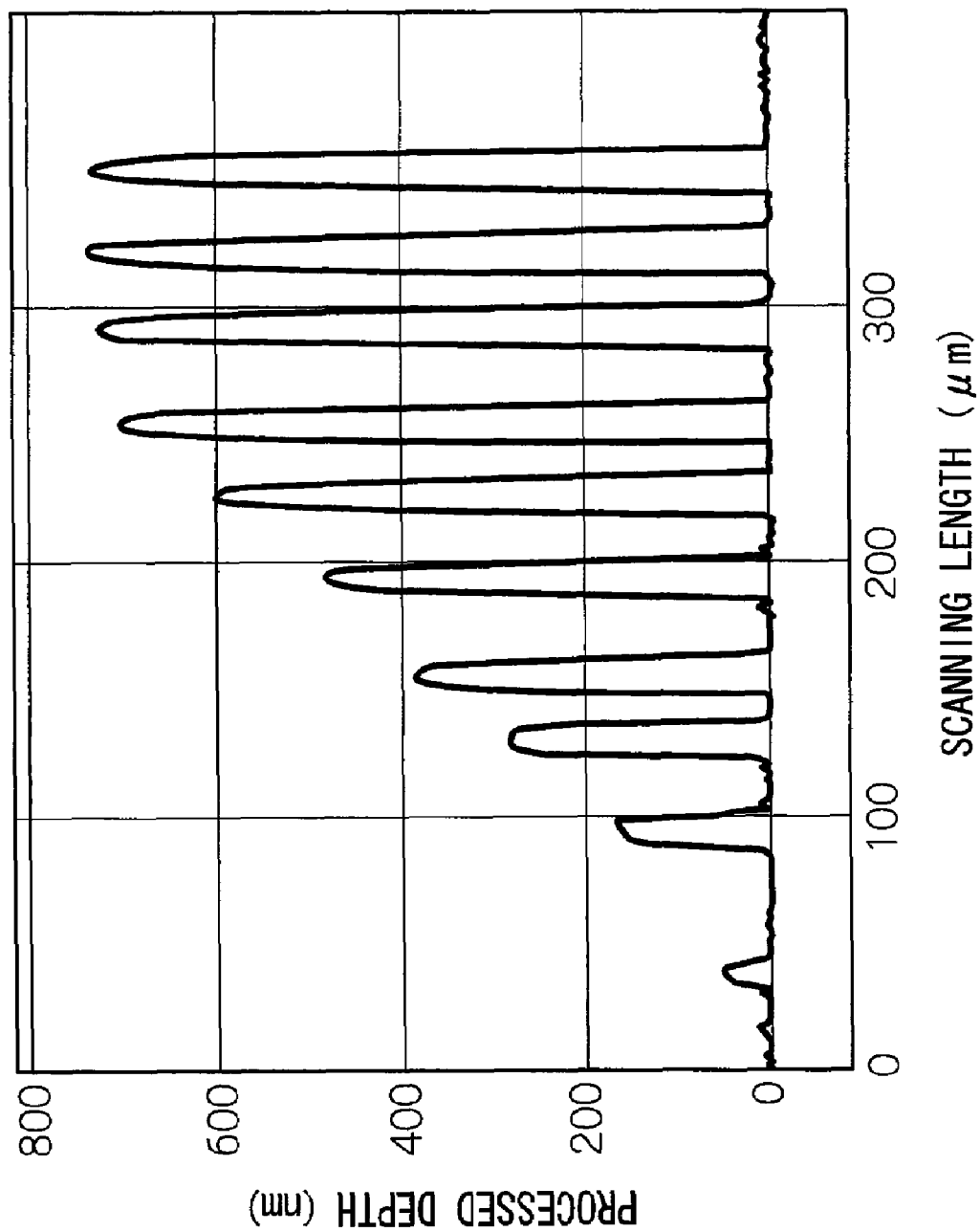
FIG. 15 is a figure showing the pattern of a fine-pattern molded product of a resin obtained in Example 6.
Figure 16:
FIG. 16 is an electron photo in which an uneven pattern of the 3-D mold obtained in Example 7 is observed from the top part.

| 10 | SUBSTRATE |
|----|-----------|
| 20 | RESIST LAYER |
| 30 | RESIN |
| 40 | GLASS |

The invention claimed is:

1. A method of producing a 3-D mold that is configured to control depth within 10 nm and form a line width of 200 nm or less, the method comprising: an irradiation step of irradiating an electron beam to a resist layer of an object of processing that has the resist layer constituted with a polysiloxane-based material on or above a substrate; and a developing step of developing the resist layer after the electron beam is irradiated to form an uneven part at the resist layer, the method further comprising producing a 3-D mold having a plurality of uneven parts of different processed depth by forming the processed depth proportional to the size of each acceleration voltage or each dosage in a plurality of irradiations in a series of steps of successively performing the plurality of irradiations by fixing one of the acceleration voltage and the dosage of an electron beam and changing the other, and then developing, wherein the irradiation step includes a step having irradiation conditions such that the acceleration voltage is from 1 kV to 3kV without generation of the backscattering and the dosage is 400 µC/cm$^2$.

2. The method of producing a 3-D mold according to claim 1, wherein an uneven part is formed at the resist layer such that a depth gradation from the substrate is at an increment of a specific value of 8nm or less by changing the acceleration voltage of the electron beam at an increment of a specific value of 50 V or lower in the irradiation step.

3. The method of producing a 3-D mold according to claim 1, or wherein the resist layer of the object of processing is formed by applying a coating liquid including SOG and an organic solvent onto a substrate and then baking at a temperature of 350° C. or higher.

4. The method of producing a 3-D mold according to claim 1, wherein a developing liquid is used to develop in the developing step.

5. The method of producing a 3-D mold according to claim 4, wherein the developing time with the developing liquid is from 60 to 300 seconds in the developing step.

6. The method of producing a 3-D mold according to claim 1, wherein the object of processing is provided with an adhesive layer between the substrate and the resist layer.

7. The method of producing a 3-D mold according to claim 1, wherein the thickness of the resist layer is from 20 nm to 10 µm.

8. A 3-D mold produced by the method according to claim 1.

9. A method of producing a finely processed product which is a substrate having an uneven part, the method comprising a step of forming an uneven part at the substrate by applying an ion beam to the resist layer of the 3-D mold produced by the method of producing a 3-D mold comprising a resist layer having an uneven part provided on a substrate according to claim 1.

10. A method of producing a fine-pattern molded product comprising a step of transferring a mold by pressing a resin to a 3-D mold using the 3-D mold produced by the method according to claim 1 as the mold for molding, and a step of peeling the resin from the pressed 3-D mold.

11. A method of producing a fine-pattern molded product comprising a step of transferring a mold by pressing a resin to a finely processed product using the finely processed product produced by the method according to claim 9 as the mold, and a step of peeling the resin from the pressed finely processed product.

12. A method of producing a fine-pattern molded product comprising a step of transferring a mold by pressing a resin to a mold using the 3-D mold according to claim 8 as a mold, and a step of peeling the resin from the pressed 3-D mold.

13. A fine-pattern molded product produced with the method according to claim 10.

14. An optical element comprising the 3-D mold according to claim 8.

15. An optical element comprising the fine-pattern molded product according to claim 13.

* * * * *

UNITED STATES PATENT AND TRADEMARK OFFICE
CERTIFICATE OF CORRECTION

PATENT NO. : 7,629,596 B2
APPLICATION NO. : 11/816773
DATED : December 8, 2009
INVENTOR(S) : Taniguchi It is certified that error appears in the above-identified patent and that said Letters Patent is hereby corrected as shown below:

Column 23, line 13 should be corrected to read "dosage is 400 $\mu C/cm^2$ or lower."

Signed and Sealed this

Twenty-third Day of February, 2010

David J. Kappos
*Director of the United States Patent and Trademark Office*